(12) United States Patent
Eom et al.

(10) Patent No.: US 11,342,315 B2
(45) Date of Patent: May 24, 2022

(54) STACK PACKAGES INCLUDING THROUGH MOLD VIA STRUCTURES

(71) Applicant: SK hynix Inc., Icheon-si (KR)

(72) Inventors: Juil Eom, Guri-si (KR); Bok Kyu Choi, Yongin-si (KR); Jae Hoon Lee, Icheon-si (KR); Jin Woo Park, Icheon-si (KR)

(73) Assignee: SK hynix Inc., Gyeonggi-do (KR)

( * ) Notice: Subject to any disclaimer, the term of this patent is extended or adjusted under 35 U.S.C. 154(b) by 341 days.

(21) Appl. No.: 16/184,741

(22) Filed: Nov. 8, 2018

(65) Prior Publication Data

US 2019/0333899 A1 Oct. 31, 2019

(30) Foreign Application Priority Data

Apr. 30, 2018 (KR) .................... 10-2018-0050263

(51) Int. Cl.
*H01L 25/10* (2006.01)
*H01L 23/31* (2006.01)
(Continued)

(52) U.S. Cl.
CPC ........ *H01L 25/105* (2013.01); *H01L 23/3107* (2013.01); *H01L 23/5383* (2013.01);
(Continued)

(58) Field of Classification Search
CPC ............... H01L 25/105; H01L 23/3107; H01L 23/5383; H01L 23/5384; H01L 23/5385; H01L 23/5386; H01L 23/5389; H01L 24/02; H01L 24/16; H01L 24/20; H01L 24/96; H01L 2224/02377; H01L 2224/02379; H01L 2224/02331;
(Continued)

(56) References Cited

U.S. PATENT DOCUMENTS 5,874,781 A * 2/1999 Fogal .................. H01L 25/0657
257/777
6,365,966 B1 * 4/2002 Chen .................... H01L 25/0657
257/723
(Continued)

FOREIGN PATENT DOCUMENTS

KR 100914977 B1 9/2009
KR 101394203 B1 5/2014

*Primary Examiner* — Khiem D Nguyen
(74) *Attorney, Agent, or Firm* — William Park & Associates Ltd.

(57) ABSTRACT

A stack package includes a first sub-package and a second sub-package stacked on the first sub-package. The first sub-package includes a first through mold via (TMV) for connection spaced apart from a first semiconductor chip in an X-axis direction, a first TMV for bypass spaced apart from the first semiconductor chip in a Y-axis direction, and a first redistribution line (RDL) pattern connecting the first semiconductor chip to the first TMV for connection. The second sub-package includes a second TMV for connection spaced apart from a second semiconductor chip in the Y-axis direction and another RDL pattern connecting the second semiconductor chip to the second TMV for connection. the second sub-package is stacked on the first sub-package such that the second TMV for connection is connected to the first TMV for bypass.

12 Claims, 26 Drawing Sheets

(51) Int. Cl.
  *H01L 23/538* (2006.01)
  *H01L 23/00* (2006.01)
  *H01L 23/498* (2006.01)
(52) U.S. Cl.
  CPC ...... *H01L 23/5384* (2013.01); *H01L 23/5385* (2013.01); *H01L 23/5386* (2013.01); *H01L 23/5389* (2013.01); *H01L 24/02* (2013.01); *H01L 24/16* (2013.01); *H01L 23/49816* (2013.01); *H01L 2224/02331* (2013.01); *H01L 2224/02373* (2013.01); *H01L 2224/02375* (2013.01); *H01L 2224/02377* (2013.01); *H01L 2224/02379* (2013.01); *H01L 2224/16235* (2013.01); *H01L 2225/1058* (2013.01)
(58) Field of Classification Search
  CPC . H01L 2224/02373; H01L 2224/16235; H01L 23/49816; H01L 25/18; H01L 25/0657
  USPC .......................................................... 257/777
  See application file for complete search history.

(56) References Cited

U.S. PATENT DOCUMENTS

| | | | | |
|---|---|---|---|---|
| 6,376,914 B2* | 4/2002 | Kovats | .............. | H01L 23/49575 257/777 |
| 6,740,970 B2* | 5/2004 | Hiraoka | .............. | H01L 23/3121 257/707 |
| 6,884,657 B1* | 4/2005 | Fogal | ................... | H01L 25/0657 257/E25.013 |
| 6,930,378 B1* | 8/2005 | St. Amand | .......... | H01L 25/0657 257/686 |
| 7,713,788 B2* | 5/2010 | Ko | ...................... | H01L 23/3128 257/E21.499 |
| 8,299,592 B2* | 10/2012 | Suh | ........................ | H01L 23/481 257/276 |
| 8,487,452 B2* | 7/2013 | Lee | .......................... | H01L 24/49 257/777 |
| 9,177,832 B2* | 11/2015 | Camacho | ............... | H01L 21/561 |
| 2009/0001602 A1* | 1/2009 | Chung | ................... | H01L 24/94 257/777 |
| 2013/0161826 A1* | 6/2013 | Son | ........................ | H01L 23/481 257/774 |
| 2017/0117263 A1* | 4/2017 | Yeh | ....................... | H01L 21/486 |
| 2018/0145060 A1* | 5/2018 | Appelt | ................ | H01L 25/0652 |
| 2019/0229101 A1* | 7/2019 | Lee | ...................... | H01L 21/56 |
| 2019/0378795 A1* | 12/2019 | Lee | ..................... | H01L 23/5386 |

* cited by examiner

STACK PACKAGES INCLUDING THROUGH MOLD VIA STRUCTURES

CROSS-REFERENCE TO RELATED APPLICATIONS

The present application claims priority under 35 U.S.C. 119(a) to Korean Application No. 10-2018-0050263, filed on Apr. 30, 2018, which is incorporated herein by references in its entirety.

BACKGROUND

1. Technical Field

The present disclosure relates to semiconductor package technologies and, more particularly, to stack packages including through mold via (TMV) structures.

2. Related Art

Recently, semiconductor packages having a high density and operating at a high speed have been required in various electronic systems. In response to such a demand, a lot of effort has been focused on increasing a band width of the semiconductor packages with a plurality of channels. In addition, the semiconductor packages have been developed to have a structure of a relatively small form factor. Therefore, a plurality of semiconductor chips may be vertically stacked to realize compact semiconductor packages having a large storage capacity.

SUMMARY

According to an embodiment, a stack package includes a first sub-package, a second sub-package stacked on the first sub-package, and a third sub-package stacked on the second sub-package opposite to the first sub-package. The first sub-package includes a first semiconductor chip, a first through mold via (TMV) for connection spaced apart from the first semiconductor chip in an X-axis direction, a first TMV for bypass spaced apart from the first semiconductor chip in a Y-axis direction, a second redistribution line (RDL) pattern connecting the first semiconductor chip to a first outer connector, and a third RDL pattern connecting the first TMV for bypass to a second outer connector. The second sub-package includes a second semiconductor chip, a second TMV for bypass spaced apart from the second semiconductor chip in the Y-axis direction and connected to the first TMV for bypass, and a fourth RDL pattern connecting the second semiconductor chip to the first TMV for connection. The third sub-package includes a third semiconductor chip and a fifth RDL pattern connecting the third semiconductor chip to the second TMV for bypass.

According to another embodiment, a stack package includes a first sub-package and a third sub-package stacked on the first sub-package. The first sub-package includes a first semiconductor chip, a first through mold via (TMV) for bypass spaced apart from the first semiconductor chip in a Y-axis direction, a second redistribution line (RDL) pattern connecting the first semiconductor chip to a first outer connector, and a third RDL pattern connecting the first TMV for bypass to a second outer connector. The third sub-package includes a third semiconductor chip and a fifth RDL pattern connecting the third semiconductor chip to the first TMV for bypass.

According to yet another embodiment, a stack package includes a first sub-package and a third sub-package stacked on the first sub-package. The first sub-package includes a first semiconductor chip, a first through mold via (TMV) for connection spaced apart from the first semiconductor chip in an X-axis direction, a first TMV for bypass spaced apart from the first semiconductor chip in a Y-axis direction, and a first redistribution line (RDL) pattern connecting the first semiconductor chip to the first TMV for connection. The third sub-package includes a third semiconductor chip, a third TMV for connection spaced apart from the third semiconductor chip in the Y-axis direction, and a fifth RDL pattern connecting the third semiconductor chip to the third TMV for connection. The third sub-package is stacked on the first sub-package such that the third TMV for connection is connected to the first TMV for bypass.

According to still another embodiment, a stack package includes a first sub-package, a second sub-package stacked on the first sub-package, and a third sub-package stacked on the second sub-package opposite to the first sub-package. The first sub-package includes a first semiconductor chip, a first mold layer covering side surfaces of the first semiconductor chip, a first through mold via (TMV) for connection spaced apart from the first semiconductor chip in an X-axis direction, a first TMV for bypass spaced apart from the first semiconductor chip in a Y-axis direction, a first redistribution line (RDL) pattern extending from a second surface of the first mold layer onto a surface of the first semiconductor chip to connect the first semiconductor chip to the first TMV for connection, a second RDL pattern disposed on a first surface of the first mold layer opposite to the first RDL pattern to connect the first TMV for connection to a first outer connector, and a third RDL pattern disposed on the first surface of the first mold layer to connect the first TMV for bypass to a second outer connector. The second sub-package includes a second semiconductor chip, a second TMV for bypass spaced apart from the second semiconductor chip in the Y-axis direction and connected to the first TMV for bypass, and a fourth RDL pattern connecting the second semiconductor chip to the first TMV for connection. The third sub-package includes a third semiconductor chip and a fifth RDL pattern connecting the third semiconductor chip to the second TMV for bypass.

DETAILED DESCRIPTION

Figure 1:
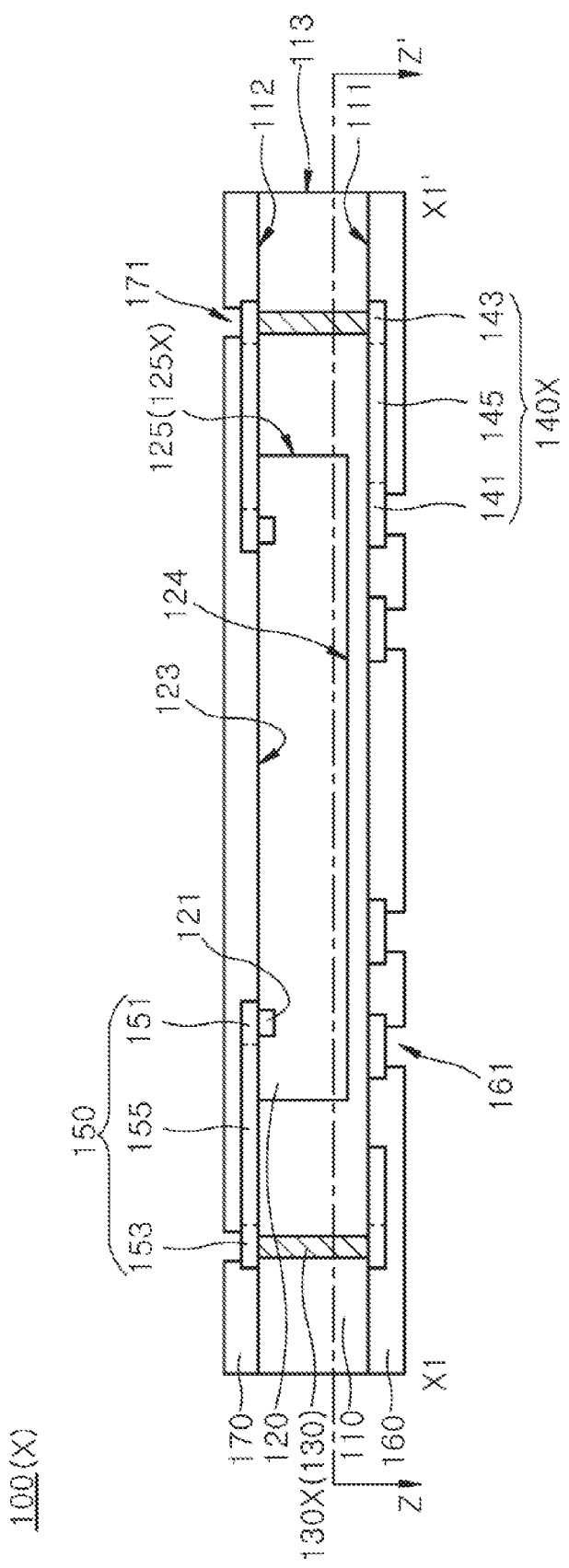
FIGS. 1 to 5 illustrate an example of a first sub-package employed in a stack package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent"). It will also be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Like reference numbers refer to like elements throughout the specification. Even though a reference number is not mentioned or described with reference to another figure, the reference number may be mentioned or described with reference to the other figure. In addition, even though a reference number is not shown in a figure, it may be mentioned or described with reference to another figure.

Figure 2:
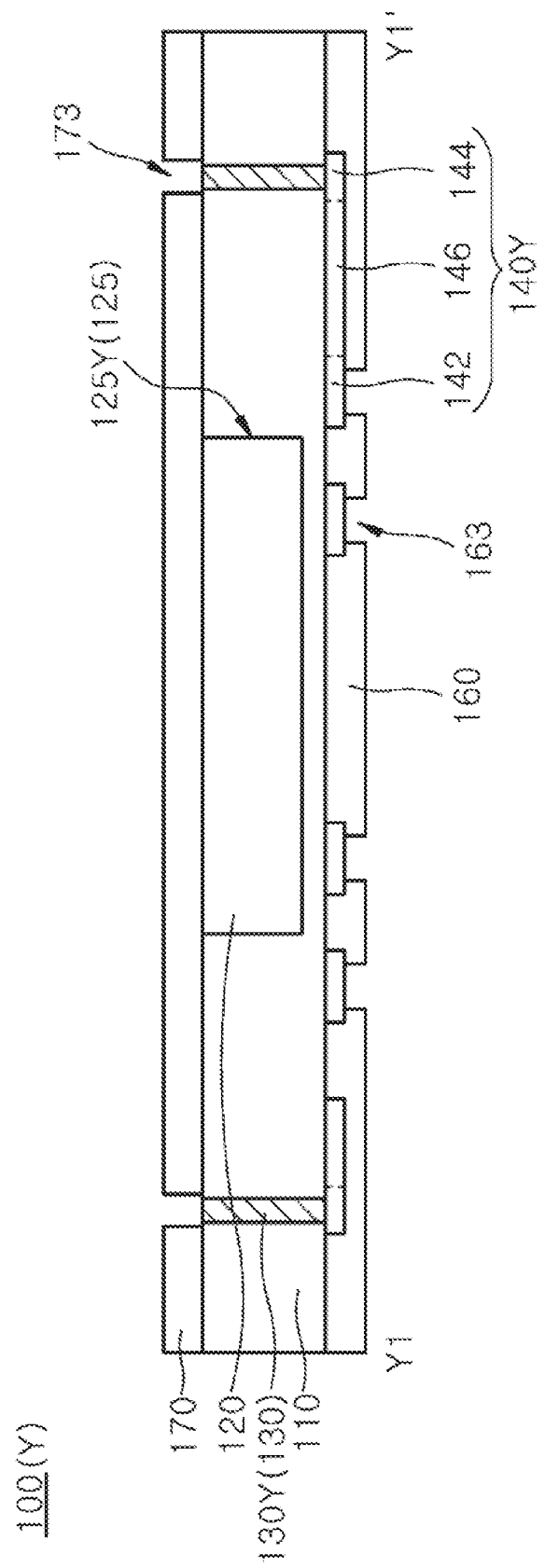
Figure 3:
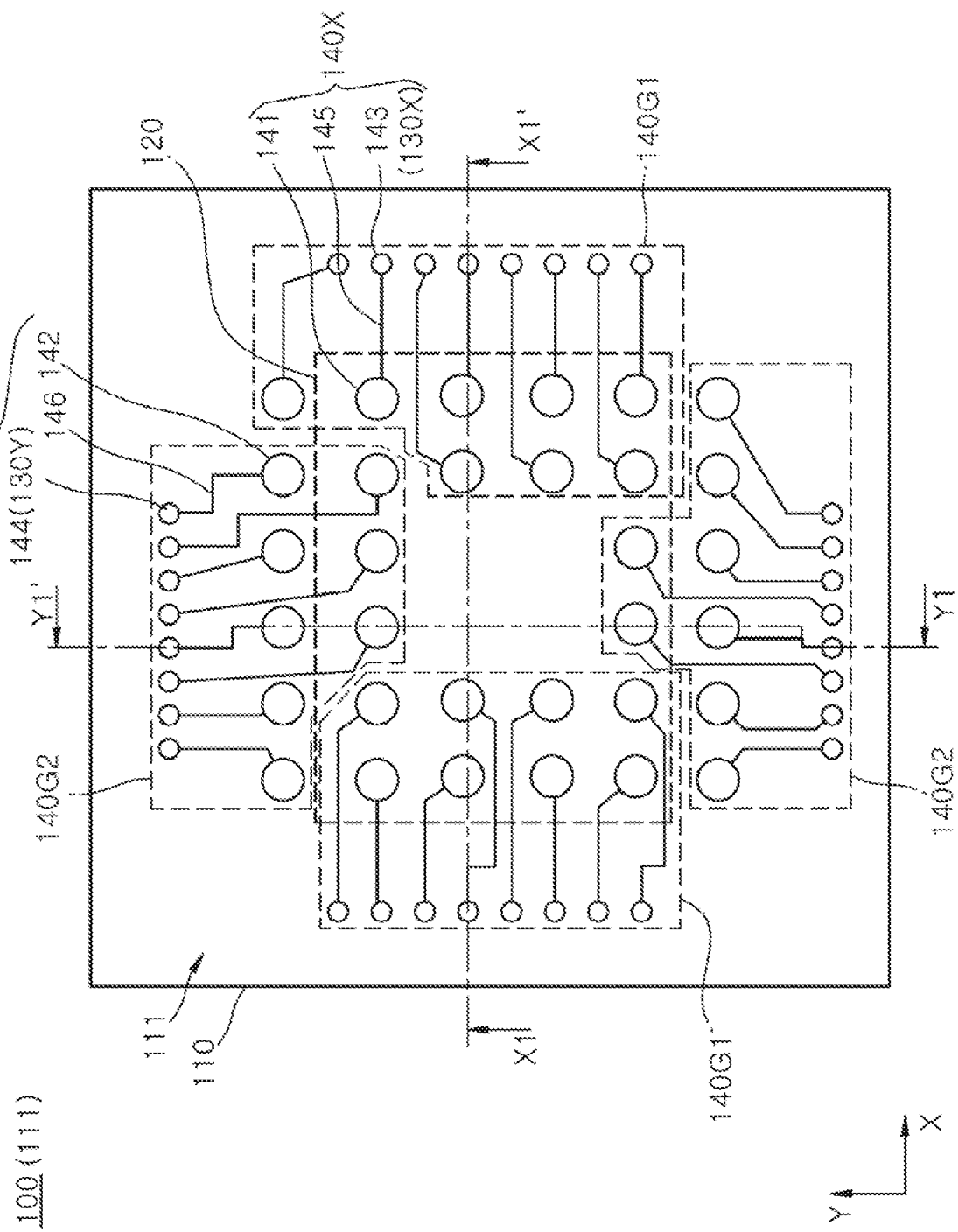
Figure 4:
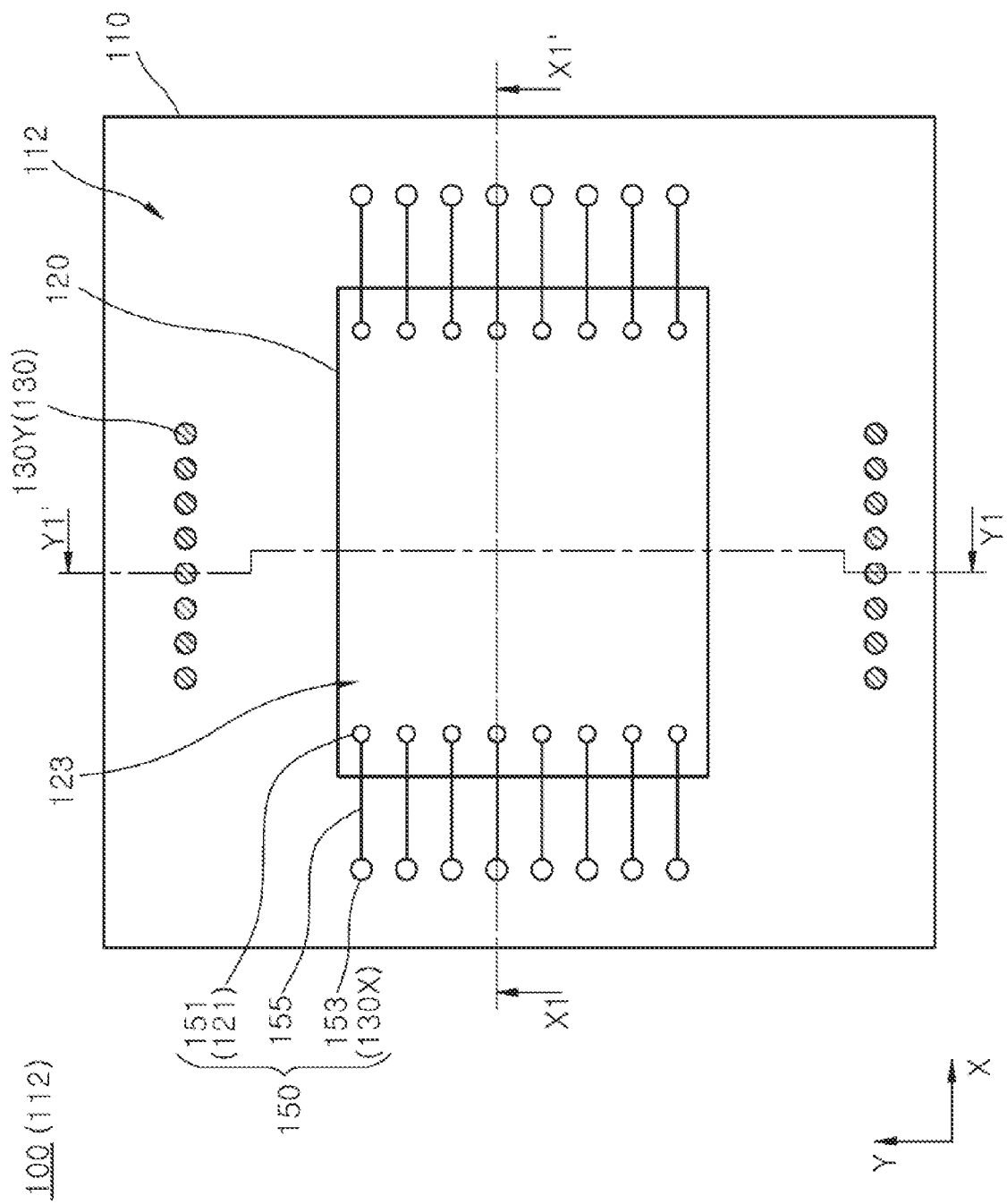
Figure 5:
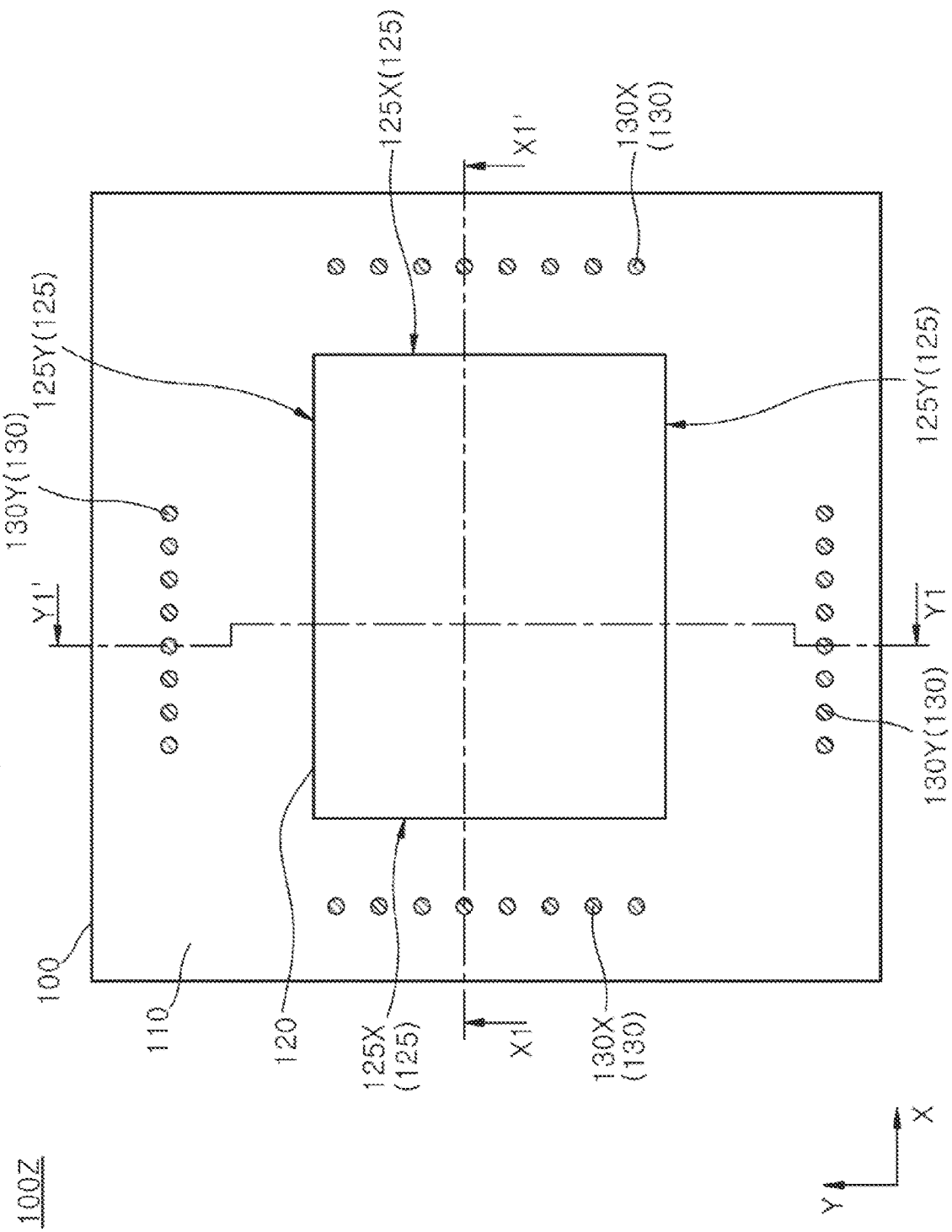

FIG. 1 is a cross-sectional view 100(X) taken along an X-axis direction of a first sub-package 100 employed in a stack package according to an embodiment. FIG. 2 is a cross-sectional view 100(Y) taken along a Y-axis direction of the first sub-package 100 illustrated in FIG. 1. FIG. 3 is a plan view 100(111) taken along a first surface 111 of a first mold layer 110 included in the first sub-package 100 illustrated in FIG. 1. FIG. 4 is a plan view 100(112) taken along a second surface 112 of the first mold layer 110 included in the first sub-package 100 illustrated in FIG. 1. FIG. 5 is a plan view 1002 in which first through mold vias (TMVs) 130 of the first sub-package 100 illustrated in FIG. 1. are disposed. FIG. 1 is a cross-sectional view taken along a line X1-X1' of FIG. 3, FIG. 2 is a cross-sectional view taken along a line Y1-Y1' of FIG. 3, and FIG. 5 is a plan view corresponding to a horizontal cross-sectional view taken along a line Z-Z' of FIG. 1.

Referring to FIG. 1, the first sub-package 100 may be configured to include a first semiconductor chip 120 surrounded by the first mold layer 110. The first sub-package 100 may include first TMVs 130 substantially penetrating the first mold layer 110. The first TMVs 130 may be conductive vias that extend from the first surface 111 of the first mold layer 110 to reach the second surface 112 of the first mold layer 110. The first surface 111 and the second surface 112 may be opposite to each other. The first surface 111 of the first mold layer 110 may correspond to a bottom surface of the first mold layer 110, and the second surface 112 of the first mold layer 110 may correspond to a top surface of the first mold layer 110. The first surface 111 of the first mold layer 110 may be connected to the second surface 112 of the first mold layer 110 by side surfaces 113. The side surfaces 113 of the first mold layer 110 may be exposed to an outside region of the first sub-package 100 to act as a portion of side surfaces of the first sub-package 100.

The first semiconductor chip 120 may be encapsulated by the first mold layer 110 for protecting the first semiconductor chip 120 from an external environment. The first mold layer 110 may be formed using at least one of various encapsulant materials. The first mold layer 110 may be formed to include an epoxy molding compound (EMC) material. A shape of the first mold layer 110 may be determined by a molding process performed using an EMC material.

The first mold layer 110 may be formed to reveal a first surface 123 of the first semiconductor chip 120 and to cover side surfaces 125 of the first semiconductor chip 120. The first mold layer 110 may extend to cover a second surface 124 of the first semiconductor chip 120. The first semiconductor chip 120 may be disposed such that the second surface 124 of the first semiconductor chip 120 is adjacent to the first surface 111 of the first mold layer 110. The first surface 123 of the first semiconductor chip 120 may be revealed and exposed at the second surface 112 of the first mold layer 110. That is, the first surface 123 of the first semiconductor chip 120 may be coplanar with the second surface 112 of the first mold layer 110. First chip pads 121 may be disposed on the first surface 123 of the first semiconductor chip 120 to function as connection terminals. The first chip pads 121 may electrically connect integrated circuits in the first semiconductor chip 120 to an external device.

Referring to FIGS. 1 and 5, the first TMVs 130 may be disposed in a periphery region (i.e., an outside region) of the first semiconductor chip 120. The first TMVs 130 may be categorized as two groups according to positions of the first TMVs 130. For example, the first TMVs 130 may be categorized as either first TMVs 130X for connection or first TMVs 130Y for bypass.

The first TMVs 130X for connection may be located at positions which are spaced apart from the first semiconductor chip 120 in the X-axis direction. The first TMVs 130X for connection may be disposed to face first side surfaces 125X included in the side surfaces 125 of the first semiconductor chip 120 in the X-axis direction. The first TMVs 130X for connection may be arrayed in columns which are parallel with the Y-axis. The first TMVs 130X for connection may be electrically connected to the first semiconductor chip 120 embedded in the first mold layer 110.

Referring to FIGS. 2 and 5, the first TMVs 130Y for bypass may be located at positions which are spaced apart from the first semiconductor chip 120 in the Y-axis direction. The first TMVs 130Y for bypass may be disposed to face second side surfaces 125Y included in the side surfaces 125 of the first semiconductor chip 120 in the Y-axis direction. The first TMVs 130Y for bypass may be arrayed in rows which are parallel with the X-axis. The first TMVs 130Y for bypass may be electrically disconnected from the first semiconductor chip 120 embedded in the first mold layer 110. The first TMVs 130Y for bypass and the first TMVs 130X for connection may be formed to have substantially the same shape. However, the first TMVs 130Y for bypass may be electrically disconnected from the first semiconductor chip 120 unlike the first TMVs 130X for connection. Thus, the first TMVs 130Y for bypass may be distinct from the first TMVs 130X for connection in terms of electrical connection.

Referring to FIGS. 1 and 4, the first sub-package 100 may include first redistribution layer (RDL) patterns 150. The first RDL patterns 150 may include conductive patterns extending from the first surface 123 of the first semiconductor chip 120 onto the second surface 112 of the first mold layer 110. For example, each of the first RDL patterns 150 may include a first extension pattern 155 and first and second contact patterns 151 and 153 respectively connected to both ends of the first extension pattern 155.

The first extension pattern 155 may extend from the first surface 123 of the first semiconductor chip 120 onto the second surface 112 of the first mold layer 110. The first contact patterns 151 of the first RDL patterns 150 may be connected to the first chip pads 121, respectively. The first contact patterns 151 may be disposed to overlap with the first chip pads 121, respectively. The second contact patterns 153 of the first RDL patterns 150 may be connected to the first TMVs 130X for connection, respectively. The second contact patterns 153 may be disposed to overlap with ends of the first TMVs 130X for connection, which are revealed at the second surface 112 of the first mold layer 110, respectively.

The first semiconductor chip 120 may be electrically connected to the first TMVs 130X for connection through the first RDL patterns 150. The first semiconductor chip 120 might not be electrically connected to the first TMVs 130Y for bypass through the first RDL patterns 150. As illustrated in FIGS. 2 and 4, the first TMVs 130Y for bypass may be electrically isolated and insulated from the first semiconductor chip 120.

Referring to FIGS. 1 and 2, the first sub-package 100 may include a first dielectric layer 170 covering the first RDL patterns 150. The first dielectric layer 170 may extend to cover the first surface 123 of the first semiconductor chip 120 and the second surface 112 of the first mold layer 110. The first dielectric layer 170 may act as an insulation layer that electrically insulates the first RDL patterns 150 from each other. As illustrated in FIG. 1, the first dielectric layer 170 may have first opening holes 171 that reveal the second contact patterns 153 of the first RDL patterns 150. In addition, as illustrated in FIG. 2, the first dielectric layer 170 may further have second opening holes 173 that reveal ends of the first TMVs 130Y for bypass.

Referring to FIG. 3, the first sub-package 100 may include second RDL patterns 140X disposed on the first surface 111 of the first mold layer 110. In addition, the first sub-package 100 may further include third RDL patterns 140Y disposed on the first surface 111 of the first mold layer 110. As illustrated in a plan view of FIG. 3, regions in which the second RDL patterns 140X are disposed may be distinct from regions in which the third RDL patterns 140Y are disposed. That is, the second RDL patterns 140X may be disposed not to vertically overlap with the third RDL patterns 140Y. The second RDL patterns 140X may be disposed in first regions 140G1 of the first surface 111 of the first mold layer 110. The first regions 140G1 may include two regions which are spaced apart from each other in the X-axis direction. The third RDL patterns 140Y may be disposed in second regions 140G2 of the first surface 111 of the first mold layer 110. The second regions 140G2 may include two regions which are spaced apart from each other in the Y-axis direction. In other embodiments, the first regions 140G1 and the second regions 140G2 may differ in geometry from the geometry illustrated by FIG. 3.

Referring to FIGS. 1 and 3, the second RDL patterns 140X may include conductive patterns disposed and elongated on the first surface 111 of the first mold layer 110. Each of the second RDL patterns 140X may include a second extension pattern 145 and third and fourth contact patterns 141 and 143 respectively connected to both ends of the second extension pattern 145. The third contact patterns 141 of the second RDL patterns 140X may be ball landing patterns which are provided to be electrically connected to an external device. The fourth contact patterns 143 of the second RDL patterns 140X may be connected to the first TMVs 130X for connection, respectively. The fourth contact patterns 143 may be disposed to overlap with ends of the first TMVs 130X for connection which are revealed at the first surface 111 of the first mold layer 110.

The fourth contact patterns 143 may be disposed to overlap with portions of the first mold layer 110 located at an outside region of the first semiconductor chip 120, in a plan view, Each of the third contact patterns 141 may be disposed to overlap with a portion of the first semiconductor chip 120 or a portion of the first mold layer 110 located at an outside region of the first semiconductor chip 120, in a plan view. Since the second extension patterns 145 connect the third contact patterns 141 to the fourth contact patterns 143, some of the second extension patterns 145 may be disposed to overlap with both of the first semiconductor chip 120 and the first mold layer 110 located at an outside region of the first semiconductor chip 120 in a plan view. As such, since at least one of the third contact patterns 141 may be disposed to overlap with a portion of the first mold layer 110 located at an outside region of the first semiconductor chip 120, the second RDL patterns 140X may have a fan-out interconnection structure.

Referring to FIGS. 2 and 3, the third RDL patterns 140Y may be disposed to have a configuration which is similar to a configuration of the second RDL patterns 140X. Each of the third RDL patterns 140Y may include a third extension pattern 146 and fifth and sixth contact patterns 142 and 144 respectively connected to both ends of the third extension pattern 146. The fifth contact patterns 142 of the third RDL patterns 140Y may be ball landing patterns which are provided to be electrically connected to an external device. The sixth contact patterns 144 of the third RDL patterns 140Y may be connected to the first TMVs 130Y for bypass, respectively. The sixth contact patterns 144 may be disposed to overlap with ends of the first TMVs 130Y for bypass which are exposed at the first surface 111 of the first mold layer 110. Some of the fifth contact patterns 142 of the third RDL patterns 140Y may be disposed to overlap with portions of the first mold layer 110 located at an outside region of the first semiconductor chip 120 in a plan view. Thus, the third RDL patterns 140Y may also have a fan-out interconnection structure.

Referring to FIGS. 1 and 2, the first sub-package 100 may include a second dielectric layer 160 covering the second and third RDL patterns 140X and 140Y. The second dielectric layer 160 may extend to cover the first surface 111 of the first mold layer 110. The second dielectric layer 160 may act as an insulation layer that electrically insulates the second and third RDL patterns 140X and 140Y from each other. As illustrated in FIG. 1, the second dielectric layer 160 may have third opening holes 161 that reveal the third contact patterns 141 of the second RDL patterns 140X. In addition, as illustrated in FIG. 2, the second dielectric layer 160 may further have fourth opening holes 163 that reveal the fifth contact patterns 142 of the third RDL patterns 140Y.

The third contact patterns 141 may function as signal transmission paths which are different from the fifth contact patterns 142. For example, while signals applied to the third contact patterns 141 are transmitted to the first semiconductor chip 120 through the second RDL patterns 140X, the first TMVs 130X for connection and the first RDL patterns 150, signals applied to the fifth contact patterns 142 may be transmitted to another semiconductor chip, which is connected to the first TMVs 130Y for bypass, through the third RDL patterns 140Y and the first TMVs 130Y for bypass.

Figure 6:
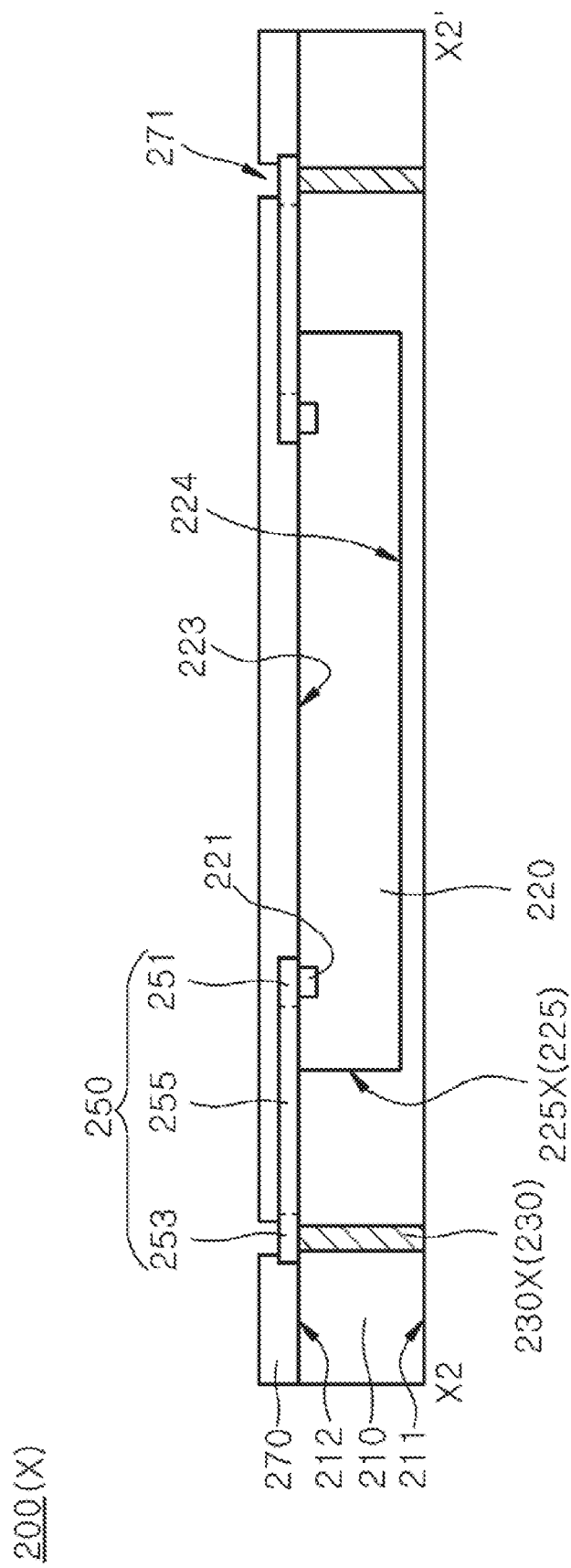
FIGS. 6 to 9 illustrate an example of a second sub-package employed in a stack package according to an embodiment.
Figure 7:
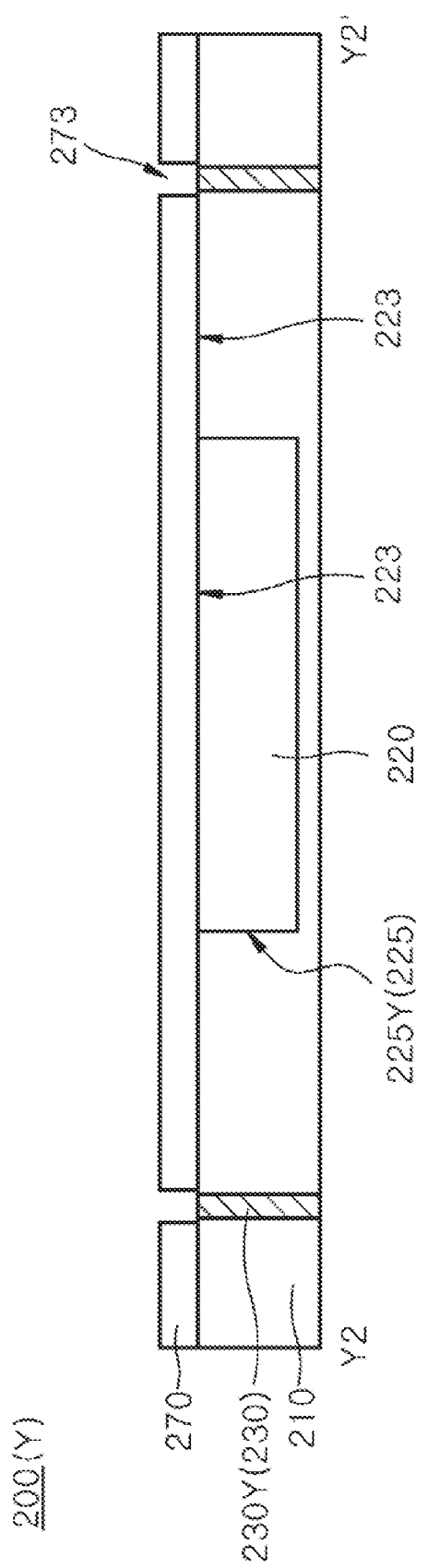
Figure 8:
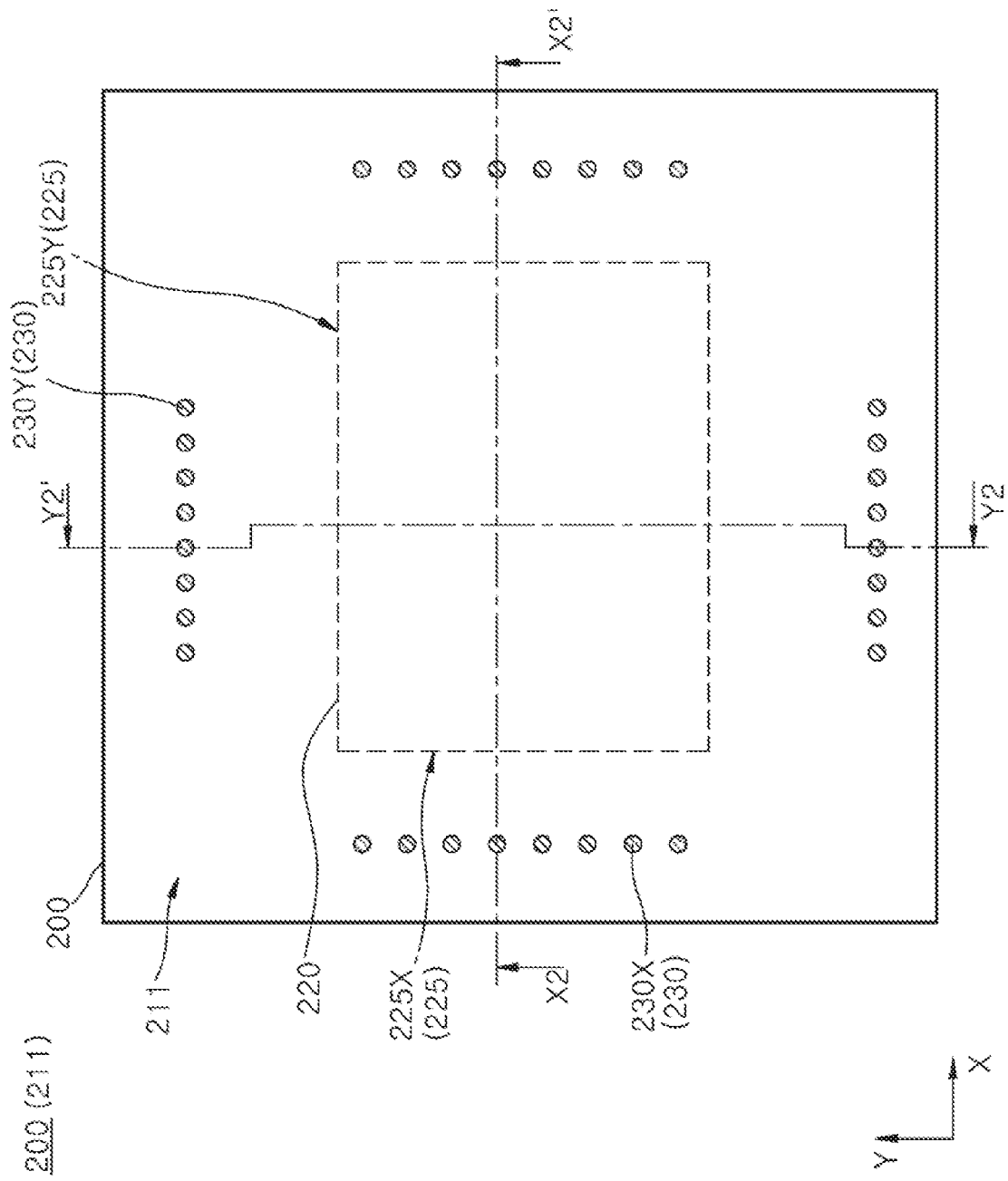
Figure 9:
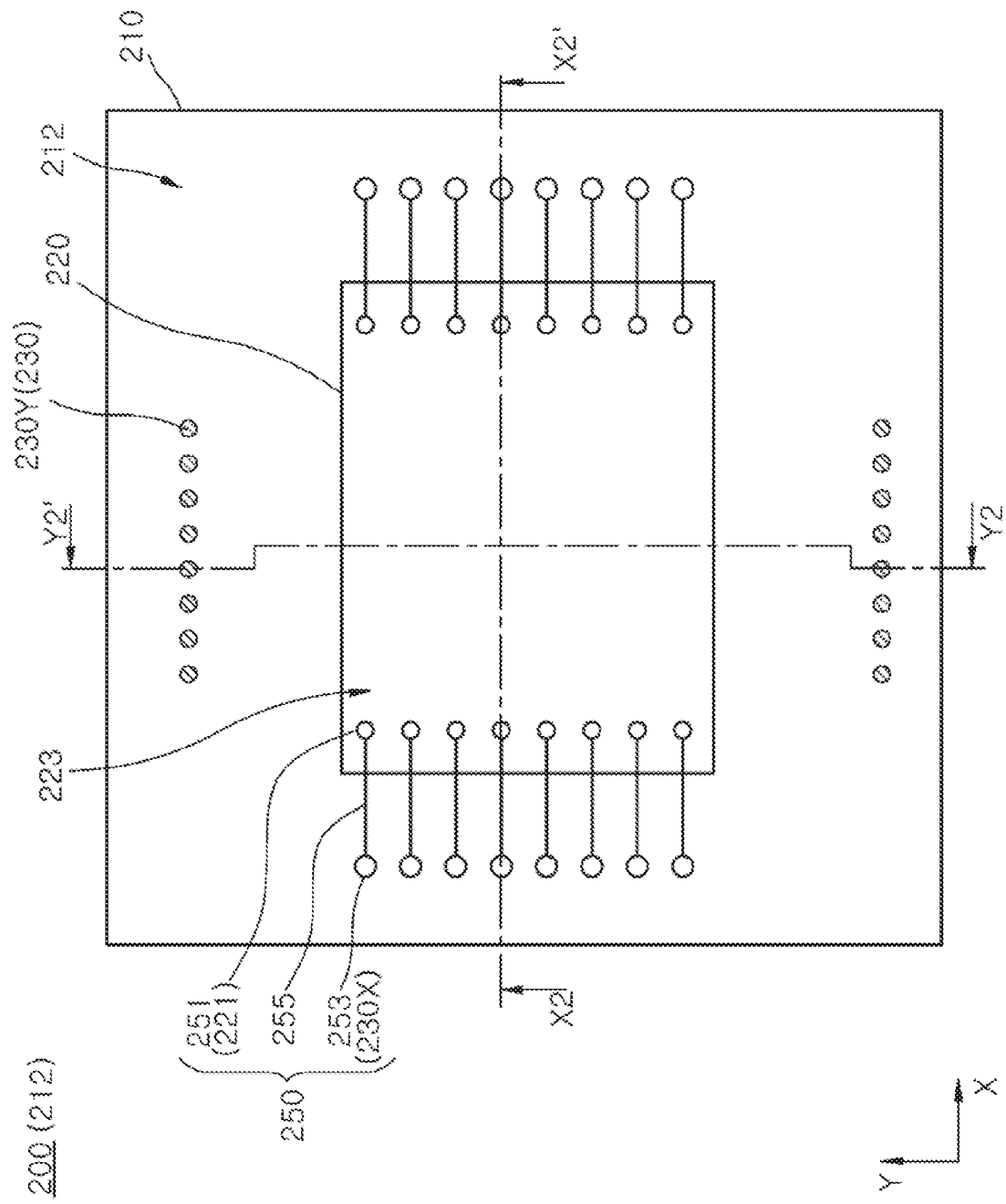

FIG. 6 is a cross-sectional view 200(X) taken along an X-axis direction of a second sub-package 200 employed in a stack package according to an embodiment. FIG. 7 is a cross-sectional view 200(Y) taken along a Y-axis direction of the second sub-package 200 illustrated in FIG. 6. FIG. 8 is a plan view 200(211) taken along a first surface 211 of a second mold layer 210 included in the second sub-package 200 illustrated in FIG. 6. FIG. 9 is a plan view 200(212) taken along a second surface 212 of the second mold layer 210 included in the second sub-package 200 illustrated in FIG. 6. FIG. 6 is a cross-sectional view taken along a line X2-X2' parallel with the X-axis direction of FIG. 8, and FIG. 7 is a cross-sectional view taken along a line Y2-Y2' parallel with the Y-axis direction of FIG. 8.

Referring to FIG. 6, the second sub-package 200 may have a shape which is similar to the first sub-package (100 of FIG. 1). The second sub-package 200 may have substantially the same shape as the first sub-package 100 except the second dielectric layer 160 and the second and third RDL patterns 140X and 140Y of the first sub-package 100 illustrated in FIGS. 1 and 2.

The second sub-package 200 may be configured to include a second semiconductor chip 220 surrounded by the second mold layer 210. The second sub-package 200 may include second TMVs 230 substantially penetrating the second mold layer 210. The second TMVs 230 may be conductive vias that extend from the first surface 211 of the second mold layer 210 to reach the second surface 212 of the second mold layer 210. The first surface 211 and the second surface 212 may be opposite to each other.

The second mold layer 210 may be formed to reveal a first surface 223 of the second semiconductor chip 220 and to cover side surfaces 225 of the second semiconductor chip 220. The second mold layer 210 may extend to cover a second surface 224 of the second semiconductor chip 220. The second semiconductor chip 220 may be disposed such that the second surface 224 of the second semiconductor chip 220 is adjacent to the first surface 211 of the second mold layer 210. The first surface 223 of the second semiconductor chip 220 may be revealed and exposed at the second surface 212 of the second mold layer 210. That is, the first surface 223 of the second semiconductor chip 220 may be coplanar with the second surface 212 of the second mold layer 210. Second chip pads 221 may be disposed on the first surface 223 of the second semiconductor chip 220 to function as connection terminals. The second chip pads 221 may electrically connect integrated circuits in the second semiconductor chip 220 to an external device. The integrated circuits in the second semiconductor chip 220 may be substantially the same circuits as the integrated circuits in the first semiconductor chip 120.

Referring to FIGS. 6 and 8, the second TMVs 230 may be disposed in a periphery region (i.e., an outside region) of the second semiconductor chip 220. The second TMVs 230 may be categorized as two groups according to positions of the second TMVs 230. For example, the second TMVs 230 may be categorized as either second TMVs 230X for connection or second TMVs 230Y for bypass.

The second TMVs 230X for connection may be located at positions which are spaced apart from the second semiconductor chip 220 in the X-axis direction. The second TMVs 230X for connection may be disposed to face first side surfaces 225X included in the side surfaces 225 of the second semiconductor chip 220 in the X-axis direction. The second TMVs 230X for connection may be arrayed in columns which are parallel with the Y-axis. The second TMVs 230X for connection may be electrically connected to the second semiconductor chip 220 embedded in the second mold layer 210.

Referring to FIGS. 7 and 8, the second TMVs 230Y for bypass may be located at positions which are spaced apart from the second semiconductor chip 220 in the Y-axis direction. The second TMVs 230Y for bypass may be disposed to face second side surfaces 225Y included in the side surfaces 225 of the second semiconductor chip 220 in the Y-axis direction. The second TMVs 230Y for bypass may be arrayed in rows which are parallel with the X-axis. The second TMVs 230Y for bypass may be electrically disconnected from the second semiconductor chip 220 embedded in the second mold layer 210. The second TMVs 230Y for bypass and the second TMVs 230X for connection may be formed to have substantially the same shape. However, the second TMVs 230Y for bypass may be electrically disconnected from the second semiconductor chip 220 unlike the second TMVs 230X for connection. Thus, the second TMVs 230Y for bypass may be distinct from the second TMVs 230X for connection in terms of electrical connection.

Referring to FIGS. 6 and 9, the second sub-package 200 may include fourth redistribution layer (RDL) patterns 250. The fourth RDL patterns 250 may include conductive patterns extending from the first surface 223 of the second semiconductor chip 220 onto the second surface 212 of the second mold layer 210. For example, each of the fourth RDL patterns 250 may include a fourth extension pattern 255 and seventh and eighth contact patterns 251 and 253 respectively connected to both ends of the fourth extension pattern 255.

The fourth extension pattern 255 may extend from the first surface 223 of the second semiconductor chip 220 onto the second surface 212 of the second mold layer 210. The fourth extension pattern 255 may extend in the X-axis direction. The seventh contact patterns 251 of the fourth RDL patterns 250 may be connected to the second chip pads 221, respectively. The seventh contact patterns 251 may be disposed to overlap with the second chip pads 221, respectively. The eighth contact patterns 253 of the fourth RDL patterns 250 may be connected to the second TMVs 230X for connection, respectively. The eighth contact patterns 253 may be disposed to overlap with ends of the second TMVs 230X for connection, which are revealed at the second surface 212 of the second mold layer 210, respectively.

The second semiconductor chip 220 may be electrically connected to the second TMVs 230X for connection through the fourth RDL patterns 250. The second semiconductor chip 220 might not be electrically connected to the second TMVs 230Y for bypass through the fourth RDL patterns 250. As illustrated in FIG. 6, the second TMVs 230Y for bypass may be electrically isolated and insulated from the second semiconductor chip 220.

Referring to FIGS. 6 and 7, the second sub-package 200 may include a third dielectric layer 270 covering the fourth RDL patterns 250. The third dielectric layer 270 may extend to cover the first surface 223 of the second semiconductor chip 220 and the second surface 212 of the second mold layer 210. The third dielectric layer 270 may act as an insulation layer that electrically insulates the fourth RDL patterns 250 from each other. As illustrated in FIG. 6, the third dielectric layer 270 may have fifth opening holes 271 that reveal the eighth contact patterns 253 of the fourth RDL patterns 250. In addition, as illustrated in FIG. 7, the third dielectric layer 270 may further have sixth opening holes 273 that reveal ends of the second TMVs 230Y for bypass.

Figure 10:
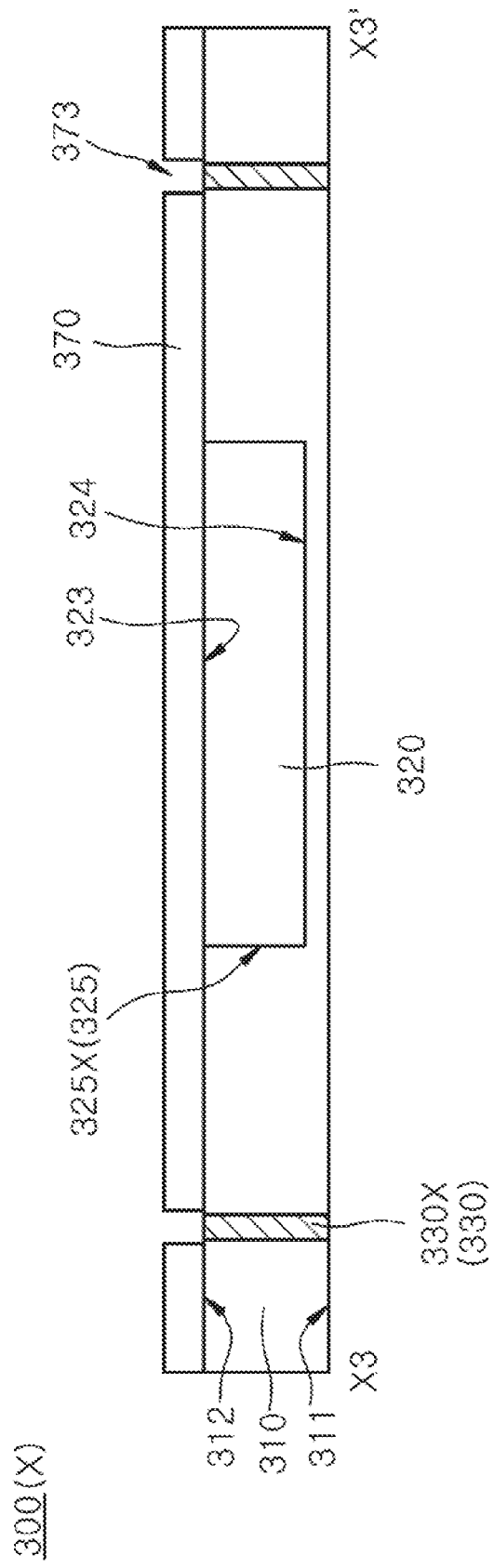
FIGS. 10 to 13 illustrate an example of a third sub-package employed in a stack package according to an embodiment.
Figure 11:
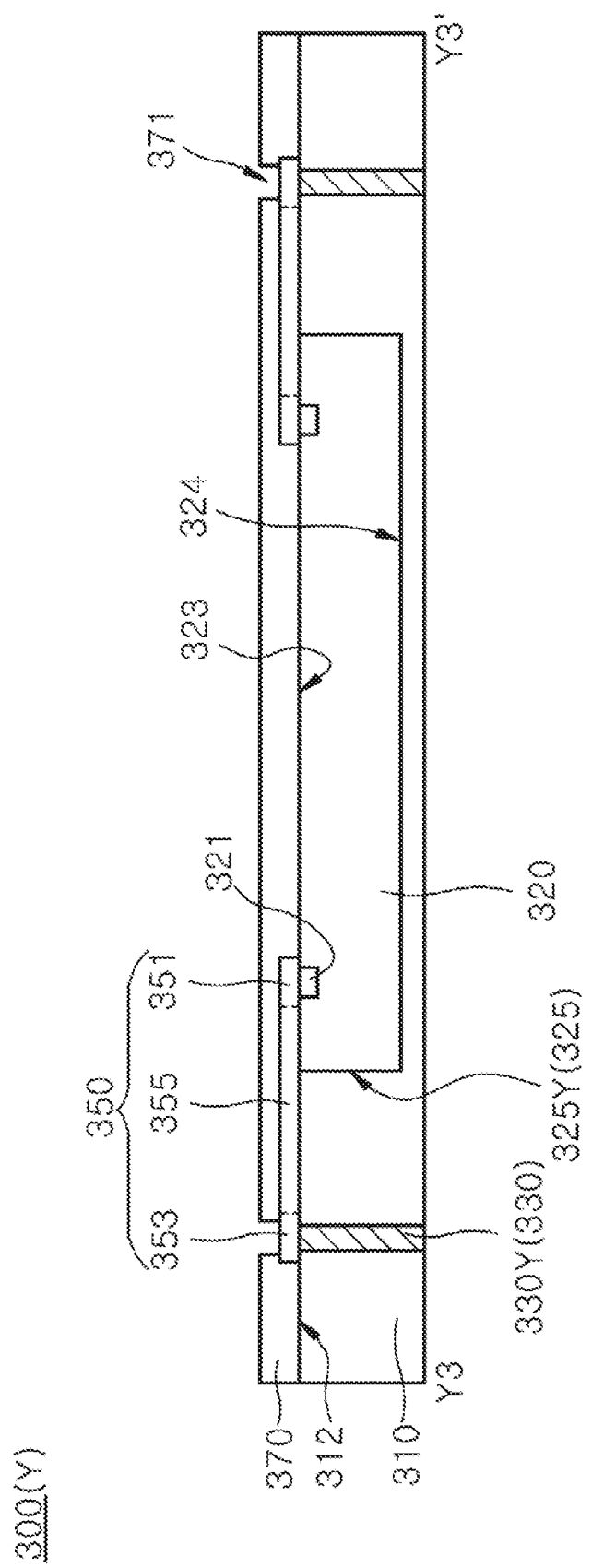
Figure 12:
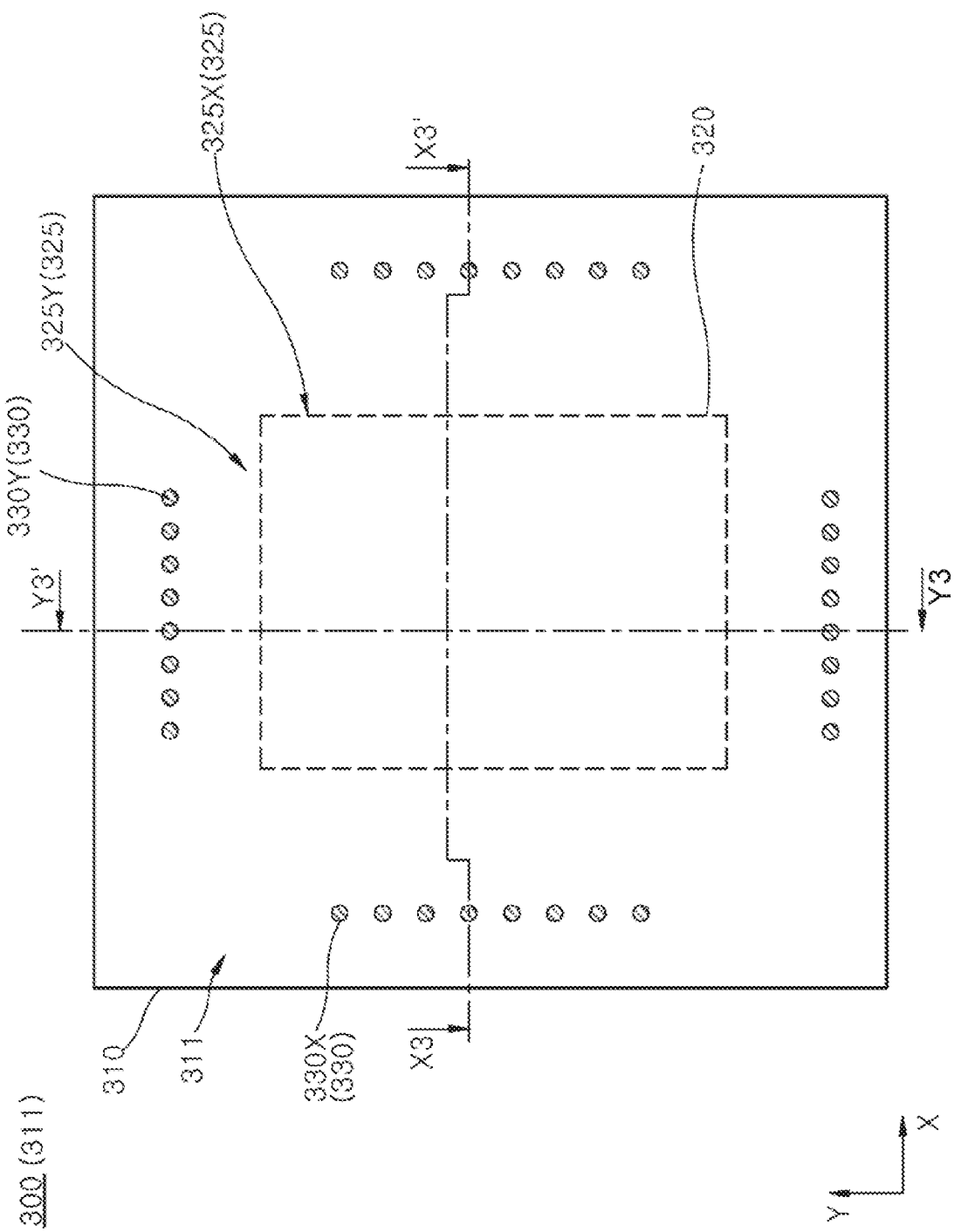
Figure 13:
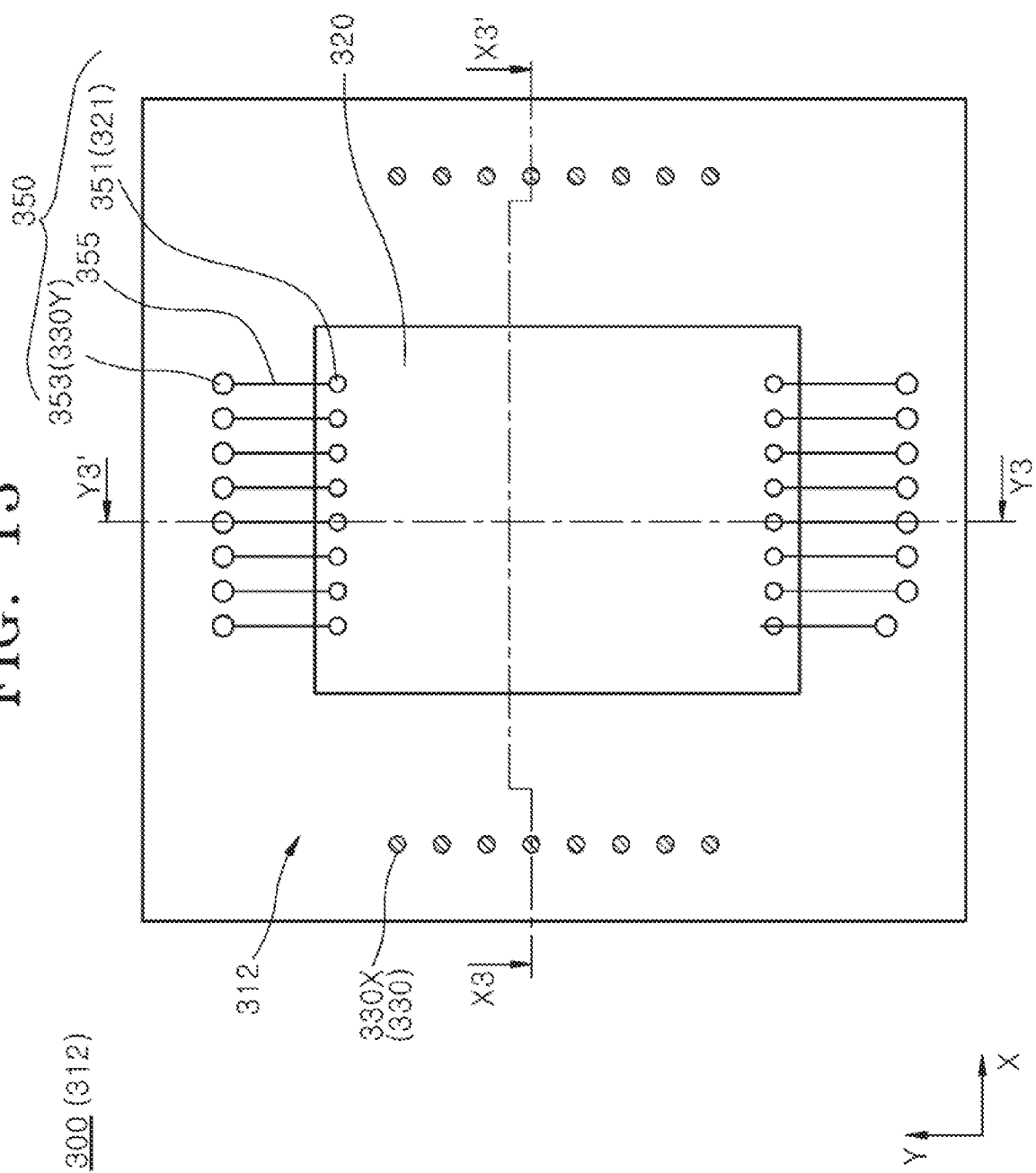

FIG. 10 is a cross-sectional view 300(X) taken along an X-axis direction of a third sub-package 300 employed in a stack package according to an embodiment. FIG. 11 is a cross-sectional view 300(Y) taken along a Y-axis direction of the third sub-package 300 illustrated in FIG. 10. FIG. 12 is a plan view 300(311) taken along a first surface 311 of a third mold layer 310 included in the third sub-package 300 illustrated in FIG. 10. FIG. 13 is a plan view 300(312) taken along a second surface 312 of the third mold layer 310 included in the third sub-package 300 illustrated in FIG. 10. FIG. 10 is a cross-sectional view taken along a line X3-X3' parallel with the X-axis direction of FIGS. 12 and 13, and FIG. 11 is a cross-sectional view taken along a line Y3-Y3' parallel with the Y-axis direction of FIGS. 12 and 13.

Referring to FIG. 10, the third sub-package 300 may have a shape which is similar to the second sub-package (200 of FIG. 9). The third sub-package 300 may have substantially the same shape as the second sub-package 200 which is rotated 90 degrees in an X-Y plane.

The third sub-package 300 may be configured to include a third semiconductor chip 320 surrounded by the third mold layer 310. The third sub-package 300 may include third TMVs 330 substantially penetrating the third mold layer 310. The third TMVs 330 may be conductive vias that extend from the first surface 311 of the third mold layer 310 to reach the second surface 312 of the third mold layer 310. The first surface 311 and the second surface 312 may be opposite to each other.

The third mold layer 310 may be formed to reveal a first surface 323 of the third semiconductor chip 320 and to cover side surfaces 325 of the third semiconductor chip 320. The third mold layer 310 may extend to cover a second surface 324 of the third semiconductor chip 320. The third semiconductor chip 320 may be disposed such that the second surface 324 of the third semiconductor chip 320 is adjacent to the first surface 311 of the third mold layer 310. The first surface 323 of the third semiconductor chip 320 may be revealed and exposed at the second surface 312 of the third mold layer 310. That is, the first surface 323 of the third semiconductor chip 320 may be coplanar with the second surface 312 of the third mold layer 310.

Referring to FIG. 11, third chip pads 321 may be disposed on the first surface 323 of the third semiconductor chip 320 to function as connection terminals. The third chip pads 321 may electrically connect integrated circuits in the third semiconductor chip 320 to an external device. The integrated circuits in the third semiconductor chip 320 may be substantially the same circuits as the integrated circuits in the second semiconductor chip 220. The third semiconductor chip 320 may have the same shape as the second semiconductor chip 220 which is rotated 90 degrees in an X-Y plane.

Referring to FIGS. 11 and 12, the third TMVs 330 may be disposed in a periphery region (i.e., an outside region) of the third semiconductor chip 320. The third TMVs 330 may be categorized as two groups according to positions of the third TMVs 330. For example, the third TMVs 330 may be categorized as either third TMVs 330Y for connection or third TMVs 330X for bypass. The third TMVs 330Y for connection may be located at positions where the second TMVs 230X for connection are rotated 90 degrees using a central point of the second sub-package 200 as an axis of rotation, in an X-Y plane. The third TMVs 330X for bypass may be located at positions where the second TMVs 230Y for bypass are rotated 90 degrees using a central point of the second sub-package 200 as an axis of rotation, in an X-Y plane. The third TMVs 330Y for connection may be disposed to vertically overlap with the second TMVs 230Y for bypass in a plan view in consideration of a case that the third sub-package 300 is stacked on the second sub-package (200 of FIG. 8). The third semiconductor chip 320 may have substantially the same shape as the second semiconductor chip 220 which is rotated 90 degrees in an X-Y plane. In such a case, the third semiconductor chip 320 may be stacked on the second semiconductor chip 220 to overlap the second semiconductor chip 220 at a right angle in an X-Y plane.

Referring to FIG. 12, the third TMVs 330Y for connection may be located at positions which are spaced apart from the third semiconductor chip 320 in the Y-axis direction. The third TMVs 330Y for connection may be disposed to face second side surfaces 325Y included in the side surfaces 325 of the third semiconductor chip 320 in the Y-axis direction. The third TMVs 330Y for connection may be arrayed in rows which are parallel with the X-axis. The third TMVs 330Y for connection may be electrically connected to the third semiconductor chip 320 embedded in the third mold layer 310.

Referring to FIGS. 10 and 12, the third TMVs 330X for bypass may be located at positions which are spaced apart from the third semiconductor chip 320 in the X-axis direction. The third TMVs 330X for bypass may be disposed to face first side surfaces 325X included in the side surfaces 325 of the third semiconductor chip 320 in the X-axis direction. The third TMVs 330X for bypass may be arrayed in columns which are parallel with the Y-axis. The third TMVs 330X for bypass may be electrically disconnected from the third semiconductor chip 320 embedded in the third mold layer 310. The third TMVs 330X for bypass and the third TMVs 330Y for connection may be formed to have substantially the same shape. However, the third TMVs 330X for bypass may be electrically disconnected from the third semiconductor chip 320 unlike the third TMVs 330Y for connection. Thus, the third TMVs 330X for bypass may be distinct from the third TMVs 330Y for connection in terms of electrical connection.

Referring to FIGS. 11 and 13, the third sub-package 300 may include fifth redistribution layer (RDL) patterns 350. The fifth RDL patterns 350 may include conductive patterns extending from the first surface 323 of the third semiconductor chip 320 onto the second surface 312 of the third mold layer 310. For example, each of the fifth RDL patterns 350 may include a fifth extension pattern 355 and ninth and tenth contact patterns 351 and 353 respectively connected to both ends of the fifth extension pattern 355.

The fifth extension pattern 355 may extend from the first surface 323 of the third semiconductor chip 320 onto the second surface 312 of the third mold layer 310. The fifth extension pattern 355 may be conductive patterns extending in the Y-axis direction. The ninth contact patterns 351 of the fifth RDL patterns 350 may be connected to the third chip pads 321, respectively. The ninth contact patterns 351 may be disposed to overlap with the third chip pads 321, respectively. The tenth contact patterns 353 of the fifth RDL patterns 350 may be connected to the third TMVs 330Y for connection, respectively. The tenth contact patterns 353 may be disposed to overlap with ends of the third TMVs 330Y for connection, which are revealed at the second surface 312 of the third mold layer 310, respectively.

The third semiconductor chip 320 may be electrically connected to the third TMVs 330Y for connection through the fifth RDL patterns 350. In contrast, the third semiconductor chip 320 might not be electrically connected to the third TMVs 330X for bypass through the fifth RDL patterns 350. As illustrated in FIG. 10, the third TMVs 330X for bypass may be electrically isolated and insulated from the third semiconductor chip 320.

Referring to FIGS. 10 and 11, the third sub-package 300 may include a fourth dielectric layer 370 covering the fifth RDL patterns 350. The fourth dielectric layer 370 may extend to cover the first surface 323 of the third semiconductor chip 320 and the second surface 312 of the third mold layer 310. The fourth dielectric layer 370 may act as an insulation layer that electrically insulates the fifth RDL patterns 350 from each other. As illustrated in FIG. 11, the fourth dielectric layer 370 may have seventh opening holes 371 that reveal the tenth contact patterns 353 of the fifth RDL patterns 350. In addition, as illustrated in FIG. 10, the fourth dielectric layer 370 may further have eighth opening holes 373 that reveal ends of the third TMVs 330X for bypass.

The third sub-package (300 of FIG. 10) may be vertically stacked on the first sub-package (100 of FIG. 1) or the second sub-package (200 of FIG. 6). Alternatively, the second sub-package (200 of FIG. 6) and the third sub-package (300 of FIG. 10) may be sequentially stacked on the first sub-package (100 of FIG. 1).

Figure 14:
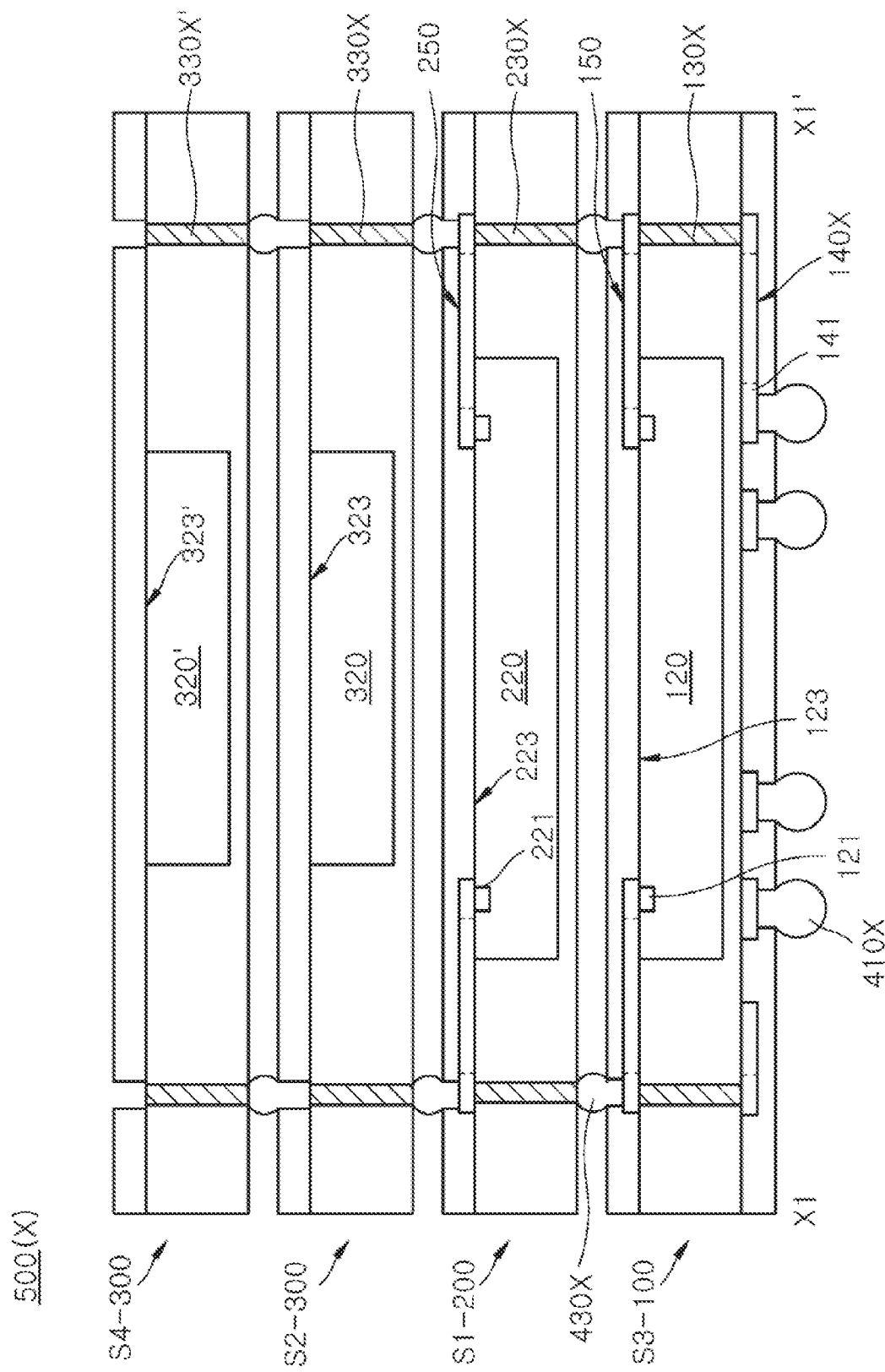
FIGS. 14 and 15 are cross-sectional views illustrating a stack package according to an embodiment.
Figure 15:
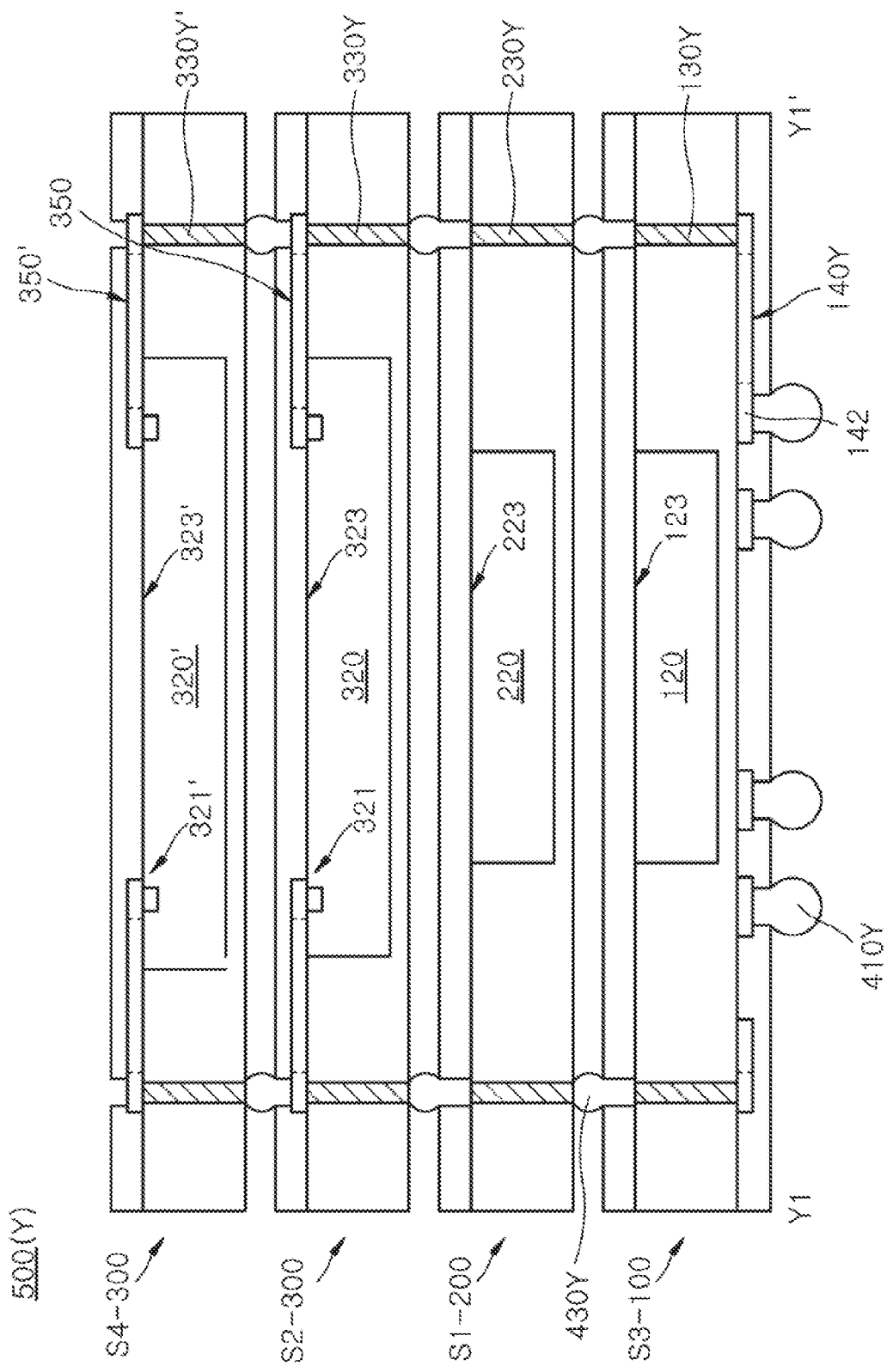

FIGS. 14 and 15 are cross-sectional views illustrating a stack package 500 according to an embodiment. FIG. 14 is a cross-sectional view 500(X) taken along an X-axis direction of the stack package 500, and FIG. 15 is a cross-sectional view 500(Y) taken along a Y-axis direction of the stack package 500. That is, FIG. 14 is a cross-sectional view 500(X) taken along a line X1-X1' of the stack package 500, and FIG. 15 is a cross-sectional view 500(Y) taken along a line Y1-Y1' of the stack package 500. The stack package 500 illustrated in FIGS. 14 and 15 may include the first sub-package (100 of FIG. 1), the second sub-package (200 of FIG. 6) and the third sub-packages (300 of FIG. 10) which are vertically stacked.

Referring to FIGS. 14 and 15, the stack package 500 may include a second stage sub-package S1-200 and a third stage sub-package S2-300 vertically stacked on the second stage sub-package S1-200. Thus, the third semiconductor chip 320 may be substantially stacked on the second semiconductor chip 220. In some cases, the second semiconductor chip 220 included in the second stage sub-package S1-200 may be referred to as a first semiconductor chip for the purpose of ease and convenience in explanation. In some other cases, the third semiconductor chip 320 included in the third stage sub-package S2-300 may be referred to as a first semiconductor chip for the purpose of ease and convenience in explanation. Although the terms "first" to "fifth" are used herein to describe the semiconductor chips, the stages of the sub-packages and the RDL patterns, these terms are only used to distinguish one element from another element, but not used to define only the element itself or to mean a particular sequence. It may be effective to understand the shapes of the semiconductor chips, the sub-packages and the RDL patterns as illustrated in the drawings. The second sub-package 200 illustrated in FIGS. 6 and 7 may be used as the second stage sub-package S1-200. The third sub-package 300 illustrated in FIGS. 10 and 11 may be used as the third stage sub-package S2-300.

A first stage sub-package S3-100 may be additionally stacked on a bottom surface of the second stage sub-package S1-200 opposite to the third stage sub-package S2-300. The first sub-package 100 illustrated in FIGS. 1 and 2 may be used as the first stage sub-package S3-100. A fourth stage sub-package S4-300 may be additionally stacked on a top surface of the third stage sub-package S2-300 opposite to the second stage sub-package S1-200. The third sub-package 300 illustrated in FIGS. 10 and 11 may be used as the fourth stage sub-package S4-300. The terms "first stage" to "fourth stage" are only used to distinguish the stacked sub-packages from one another, but not used to define only the sub-package itself or to mean a particular sequence.

The first to fourth stage sub-packages S3-100, S1-200, S2-300 and S4-300 may be electrically connected to each other by inner connectors 430X, 430Y. The inner connectors 430X, 430Y may be conductive bumps.

Referring to FIG. 14, the second TMVs 230X for connection of the second stage sub-package S1-200 may be electrically connected to the second semiconductor chip 220 in the second stage sub-package S1-200 through the fourth RDL patterns 250. That is, the second TMVs 230X for connection and the fourth RDL patterns 250 may act as connection paths that electrically connect the second semiconductor chip 220 to another semiconductor chip or another sub-package.

The second TMVs 230X for connection of the second stage sub-package S1-200 may be electrically connected to the first TMVs 130X for connection of the first stage sub-package S3-100 located below the second stage sub-package S1-200 opposite to the third stage sub-package S2-300. The second TMVs 230X for connection may be electrically connected to the first TMVs 130X for connection through the first inner connectors 430X. The first TMVs 130X for connection of the first stage sub-package S3-100 may be electrically connected to the second RDL patterns 140X. First outer connectors 410X may be attached to the third contact patterns 141 of the second RDL patterns 140X. The first outer connectors 410X may be connection members that connect the stack package 500 to an external device. The first outer connectors 410X may be solder balls or bumps.

The first outer connectors 410X, the second RDL patterns 140X, the first TMVs 130X for connection of the first stage sub-package S3-100, the second TMVs 230X for connection of the second stage sub-package S1-200, and the fourth RDL patterns 250 may act as electrical connection paths of the second semiconductor chip 220. In addition, the first outer connectors 410X, the second RDL patterns 140X, the first TMVs 130X for connection of the first stage sub-package S3-100, and the first RDL patterns 150 may act as electrical connection paths of the first semiconductor chip 120.

The third TMVs 330X for bypass of the third stage sub-package S2-300 may be electrically connected to the second TMVs 230X for connection of the second stage sub-package S1-200. However, the third TMVs 330X for bypass of the third stage sub-package S2-300 and fourth TMVs 330X' for bypass of the fourth stage sub-package S4-300 may correspond to dummy vias that are electrically disconnected from the third semiconductor chip 320 in the third stage sub-package S2-300 and a fourth semiconductor chip 320' in the fourth stage sub-package S4-300. Thus, the third semiconductor chip 320 embedded in the third stage sub-package S2-300 and the fourth semiconductor chip 320' embedded in the fourth stage sub-package S4-300 may be electrically disconnected from the first outer connectors 410X.

Referring to FIG. 15, the third TMVs 330Y for connection of the third stage sub-package S2-300 may be electrically connected to the third semiconductor chip 320 in the third stage sub-package S2-300 through the fifth RDL patterns 350. That is, the third TMVs 330Y for connection and the fifth RDL patterns 350 may act as connection paths that electrically connect the third semiconductor chip 320 to another semiconductor chip or another sub-package. Similarly, fourth TMVs 330Y' for connection of the fourth stage sub-package S4-300 may be electrically connected to the fourth semiconductor chip 320' in the fourth stage sub-package S4-300 through sixth RDL patterns 350'. The fourth TMVs 330Y' for connection may have substantially the same shape as the third TMVs 330Y for connection, the sixth RDL patterns 350' may have substantially the same shape as the fifth RDL patterns 350, and the fourth semiconductor chip 320' may have substantially the same shape as the third semiconductor chip 320.

The third TMVs 330Y for connection of the third stage sub-package S2-300 may be electrically connected to the second TMVs 230Y for bypass located below the third stage sub-package S2-300 opposite to the fourth stage sub-package S4-300. The third TMVs 330Y for connection may be electrically connected to the second TMVs 230Y for bypass through the second inner connectors 430Y. The second TMVs 230Y for bypass of the second stage sub-package S1-200 may be electrically connected to the first TMVs 130Y for bypass of the first stage sub-package S3-100 through the second inner connectors 430Y. The first TMVs 130Y for bypass may be electrically connected to the third RDL patterns 140Y. Second outer connectors 410Y may be attached to the fifth contact patterns 142 of the third RDL patterns 140Y. The second outer connectors 410Y may be connection members that connect the stack package 500 to an external device. The second outer connectors 410Y may be distinct from the first outer connectors 410X in terms of electrical connection.

The second outer connectors 410Y, the third RDL patterns 140Y, the first TMVs 130Y for bypass of the first stage sub-package S3-100, the second TMVs 230Y for bypass of the second stage sub-package S1-200, the third TMVs 330Y for connection of the third stage sub-package S2-300, and the fifth RDL patterns 350 may act as electrical connection paths of the third semiconductor chip 320. In addition, the second outer connectors 410Y, the third RDL patterns 140Y, the first TMVs 130Y for bypass of the first stage sub-package S3-100, the second TMVs 230Y for bypass of the second stage sub-package S1-200, the third TMVs 330Y for connection of the third stage sub-package S2-300, the fourth TMVs 330Y' for connection of the fourth stage sub-package S4-300, and the sixth RDL patterns 350' may act as electrical connection paths of the fourth semiconductor chip 320'. The second TMVs 230Y for bypass of the second stage sub-package S1-200 and the first TMVs 130Y for bypass of the first stage sub-package S3-100 may act as medium connection paths that connect the third TMVs 330Y for connection to the second outer connectors 410Y.

The stack package 500 illustrated in FIGS. 14 and 15 may be configured to include the first to fourth stage sub-packages S3-100, S1-200, S2-300 and S4-300. However, in some other embodiments, the stack package 500 may be configured to include only two stages of sub-packages, for example, the first stage sub-package S3-100 and the third stage sub-package S2-300.

Figure 16:
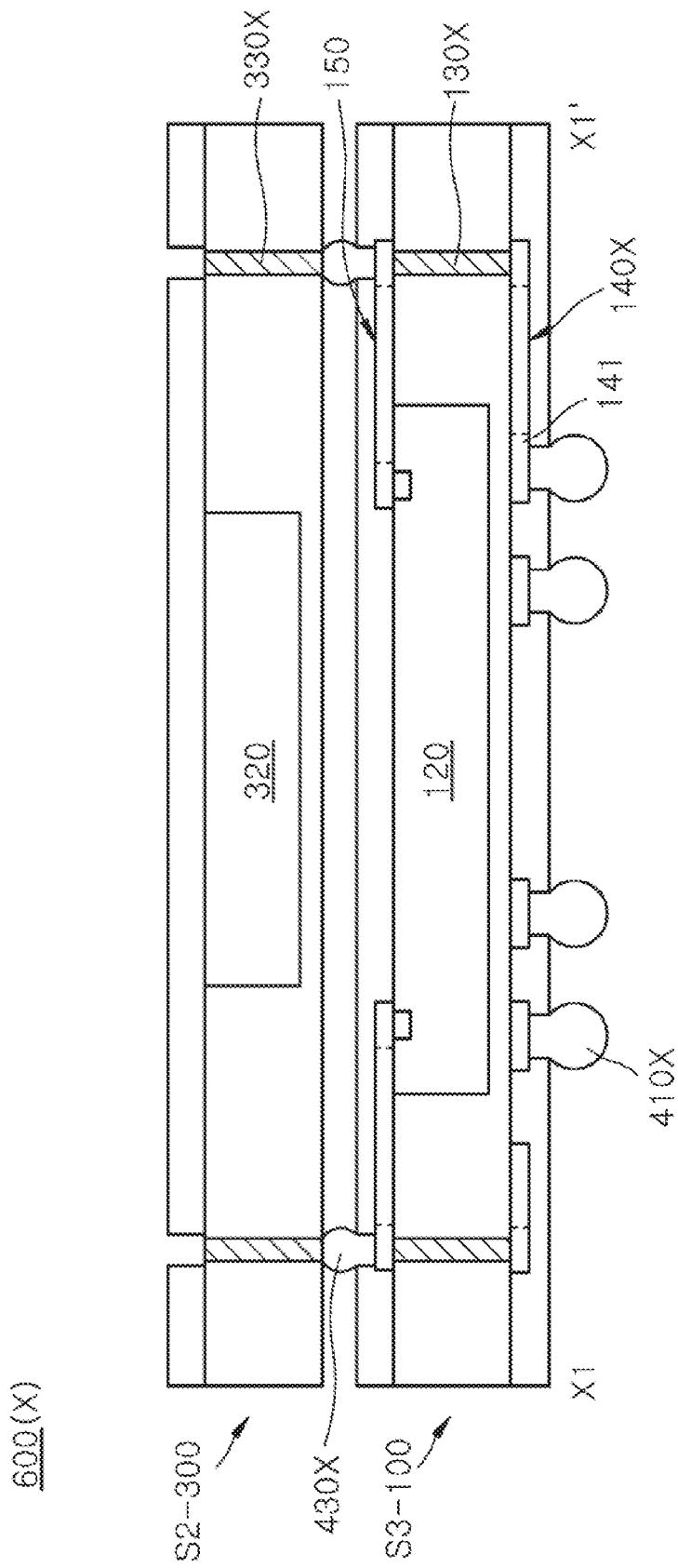
FIGS. 16 and 17 are cross-sectional views illustrating a stack package according to another embodiment.
Figure 17:
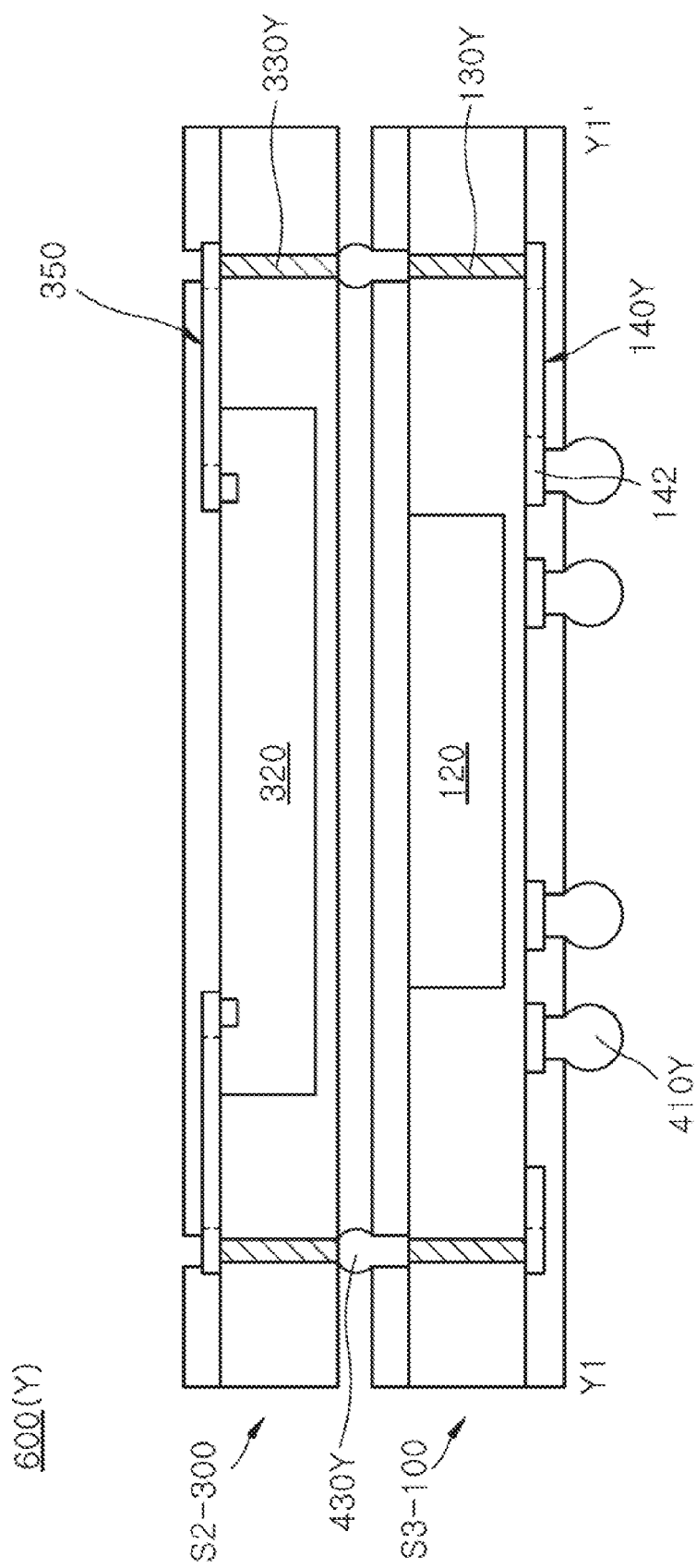

A stack package 600 illustrated in FIGS. 16 and 17 may provide an example of a structure including the first stage sub-package S3-100 and the third stage sub-package S2-300 which are sequentially stacked. FIG. 16 is a cross-sectional view 600(X) taken along an X-axis direction of the stack package 600, and FIG. 17 is a cross-sectional view 600(Y) taken along a Y-axis direction of the stack package 600.

Referring to FIGS. 16 and 17, the first TMVs 130X for connection of the first stage sub-package S3-100 may act as connection paths that electrically connect the first semiconductor chip 120 to the first outer connectors 410X. The third TMVs 330Y for connection of the third stage sub-package S2-300 and the first TMVs 130Y for bypass of the first stage sub-package S3-100 may act as connection paths that electrically connect the third semiconductor chip 320 to the second outer connectors 410Y.

Referring again to FIGS. 14 and 15, the plurality of semiconductor chips 120, 220, 320 and 320' may be stacked to have a faced-up shape to provide the stack package 500. However, in some other embodiments, the plurality of semiconductor chips 120, 220, 320 and 320' may be stacked to have a faced-down shape such that all of the first surfaces 123, 223, 323 and 323' of the semiconductor chips 120, 220, 320 and 320' face the first and second outer connectors 410X and 410Y. In such a case, positions and electrical connection of the first, second and third RDL patterns 150, 140X and 140Y may be changed.

FIGS. 18 to 21 illustrate another first sub-package 1100 employed in a stack package according to an embodiment. The first sub-package 1100 illustrated in FIGS. 18 to 21 may correspond to another example of the first sub-package 100 described with reference to FIGS. 1 to 5. In FIGS. 18 to 21, members having the same shapes as illustrated in FIGS. 1 to 5 may be construed as substantially the same elements.

Figure 18:
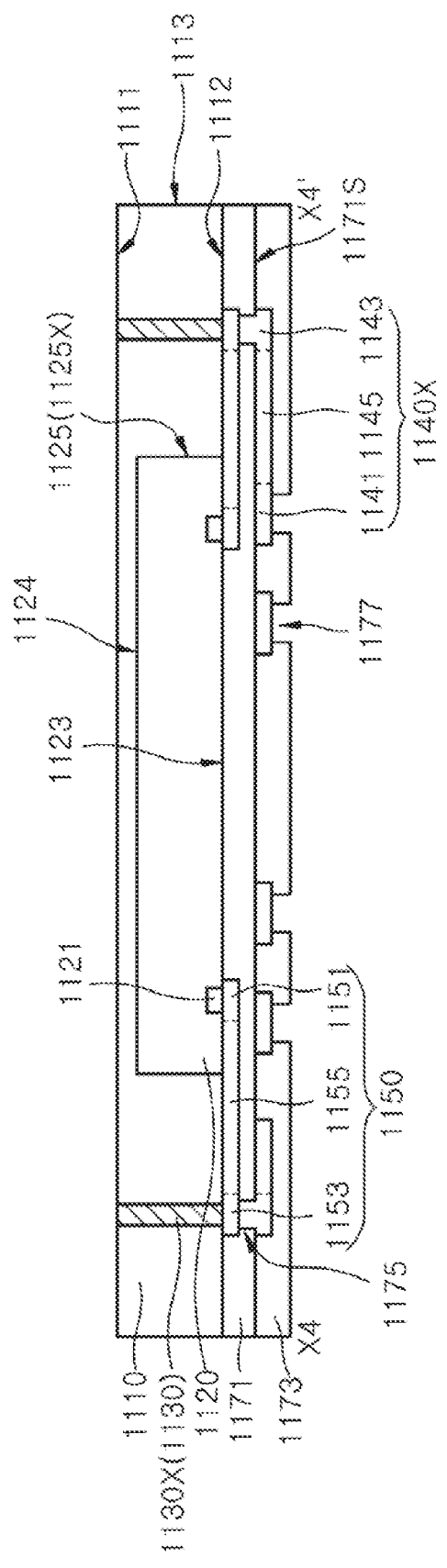
FIGS. 18 to 21 illustrate another example of a first sub-package employed in a stack package according to an embodiment.
Figure 19:
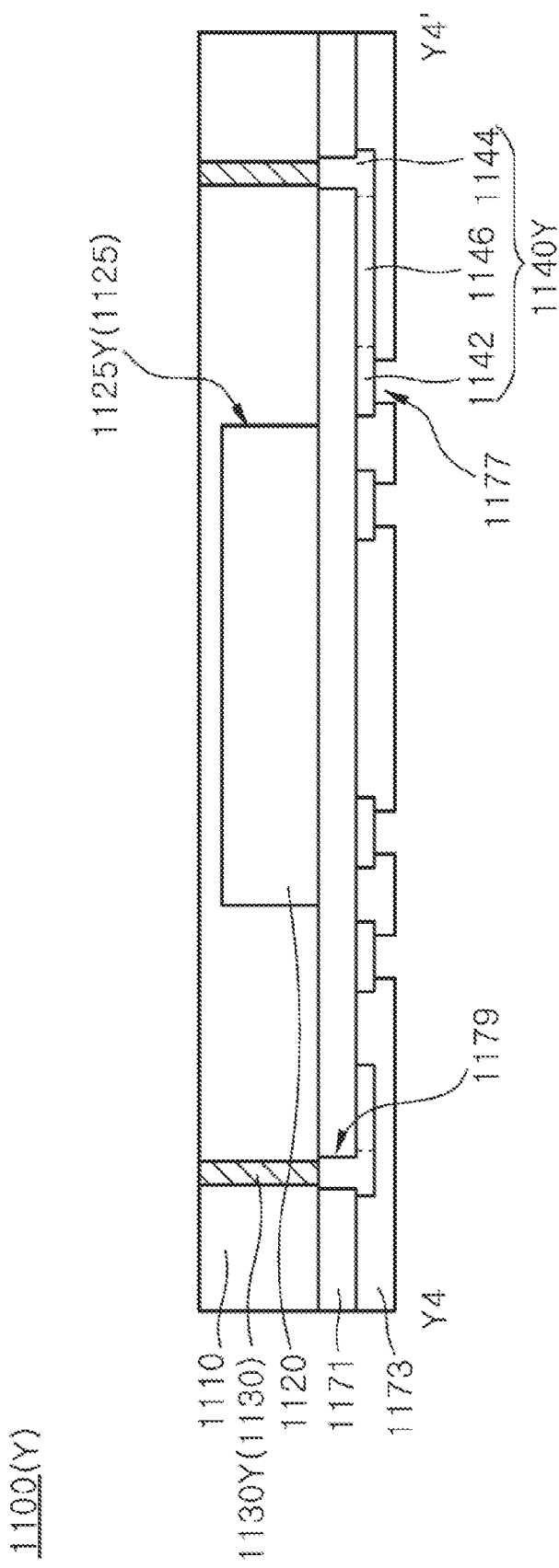
Figure 20:
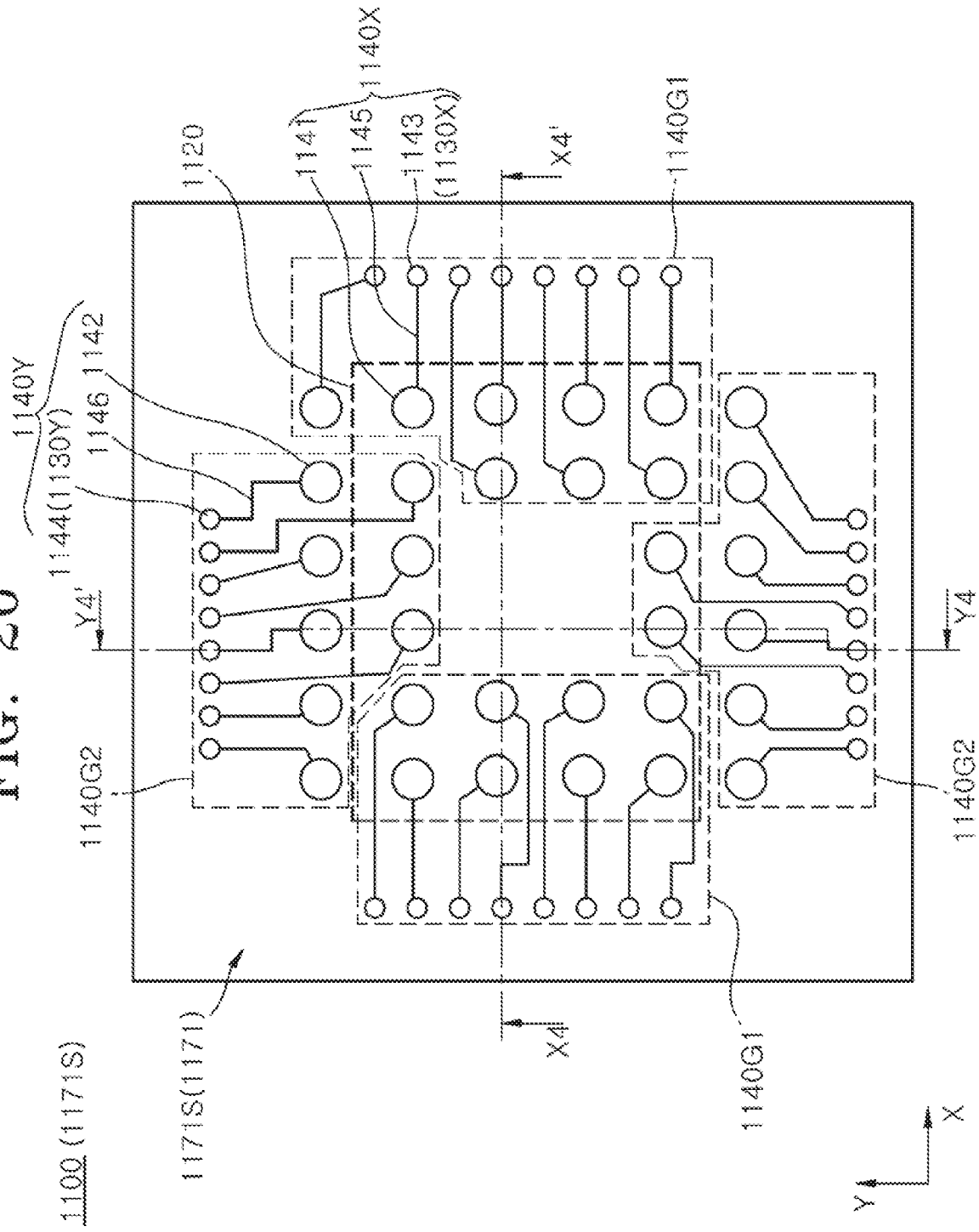
Figure 21:
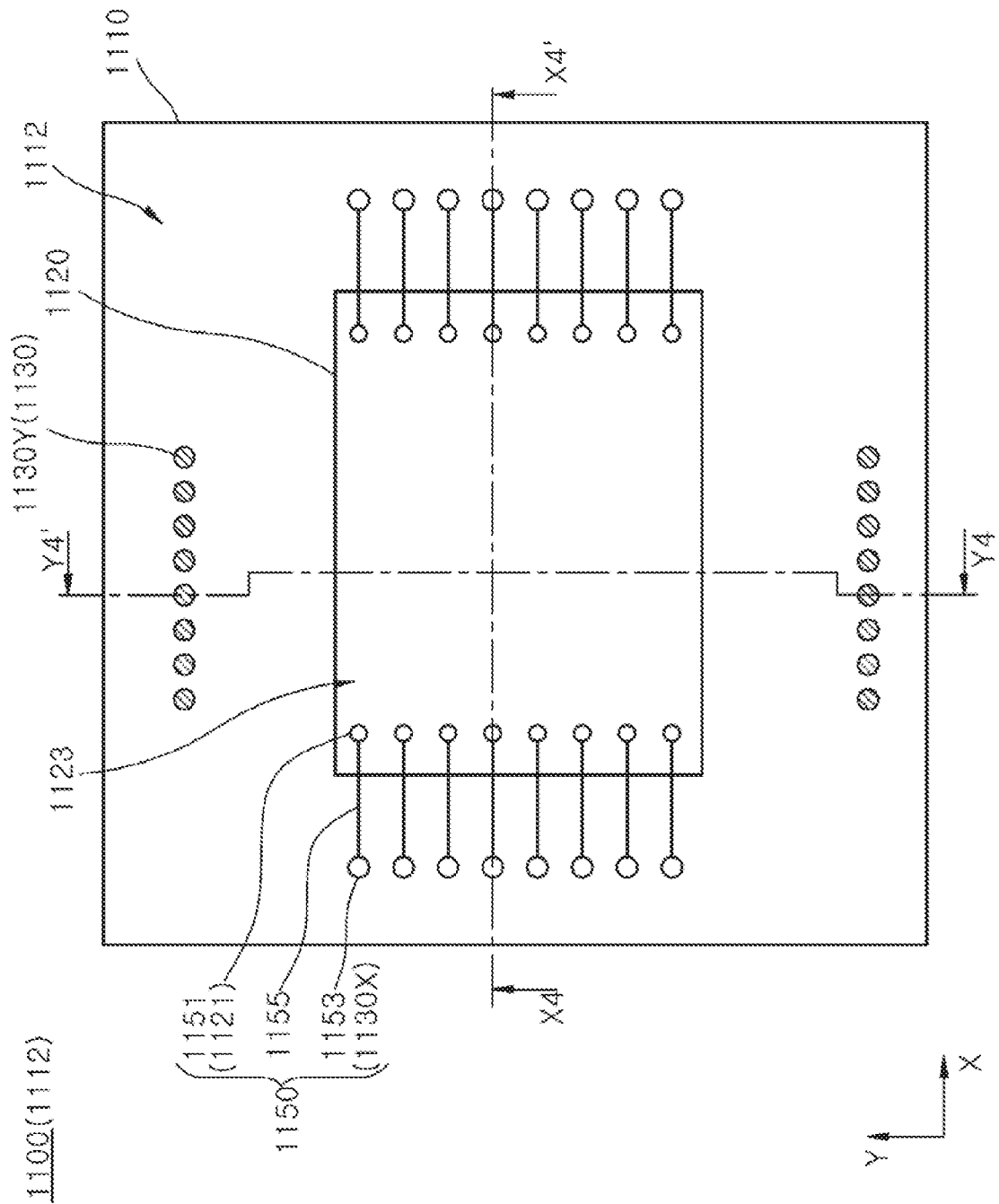

FIG. 18 is a cross-sectional view 1100(X) taken along an X-axis direction of the first sub-package 1100. FIG. 19 is a cross-sectional view 1100(Y) taken along a Y-axis direction of the first sub-package 1100. FIG. 20 is a plan view 1100(1171S) taken along a surface 1171S of a first dielectric layer 1171 included in the first sub-package 1100 illustrated in FIG. 18. FIG. 21 is a plan view 1100(1112) taken along a first surface 1112 of a first mold layer 1110 included in the first sub-package 1100 illustrated in FIG. 18. FIG. 18 is a cross-sectional view taken along a line X4-X4' of FIGS. 20 and 21, and FIG. 19 is a cross-sectional view taken along a line Y4-Y4' of FIGS. 20 and 21.

Referring to FIG. 18, the first sub-package 1100 may be configured to include a first semiconductor chip 1120 surrounded by the first mold layer 1110. The first sub-package 1100 may include first TMVs 1130 substantially penetrating the first mold layer 1110. The first TMVs 1130 may be conductive vias that extend from the first surface 1112 of the first mold layer 1110 to reach a second surface 1111 of the first mold layer 1110.

The first surface 1112 and the second surface 1111 may be opposite to each other. The first surface 1112 and the second surface 1111 of the first mold layer 1110 may be construed as a second surface and a first surface for convenience in explanation, respectively. Side surfaces 1113 of the first mold layer 1110 may be portions of side surfaces of the first sub-package 1100 and may be revealed or exposed to an outside region of the first sub-package 1100. The first mold layer 1110 may reveal a first surface 1123 of the first semiconductor chip 1120 and may extend to cover side surfaces 1125 of the first semiconductor chip 1120. The first mold layer 1110 may also extend to cover a second surface 1124 of the first semiconductor chip 1120.

First chip pads 1121 may be disposed on the first surface 1123 of the first semiconductor chip 1120 to act as connection terminals.

Referring to FIGS. 18 and 21, the first TMVs 1130 may be categorized as either first TMVs 1130X for connection or first TMVs 1130Y for bypass. The first TMVs 1130X for connection may be located at positions which are spaced apart from the first semiconductor chip 1120 in the X-axis direction. The first TMVs 1130X for connection may be disposed to face first side surfaces 1125X included in the side surfaces 1125 of the first semiconductor chip 1120 in the X-axis direction. The first TMVs 1130X for connection may be electrically connected to the first semiconductor chip 1120 embedded in the first mold layer 1110.

Referring to FIGS. 19 and 21, the first TMVs 1130Y for bypass may be located at positions which are spaced apart from the first semiconductor chip 1120 in the Y-axis direction. The first TMVs 1130Y for bypass may be disposed to face second side surfaces 1125Y included in the side surfaces 1125 of the first semiconductor chip 1120 in the Y-axis direction. The first TMVs 1130Y for bypass may be electrically disconnected and isolated from the first semiconductor chip 1120 embedded in the first mold layer 1110.

Referring again to FIGS. 18 and 21, the first sub-package 1100 may include first redistribution layer (RDL) patterns 1150. The first RDL patterns 1150 may electrically connect the first TMVs 1130X for connection to the first semiconductor chip 1120, The first RDL patterns 1150 may include conductive patterns extending from the first surface 1123 of the first semiconductor chip 1120 onto the first surface 1112 of the first mold layer 1110, Specifically, each of the first RDL patterns 1150 may include a first extension pattern 1155 and first and second contact patterns 1151 and 1153 respectively connected to both ends of the first extension pattern 1155. The first extension pattern 1155 may extend from the first surface 1123 of the first semiconductor chip 1120 onto the first surface 1112 of the first mold layer 1110. The first contact patterns 1151 of the first RDL patterns 1150 may be connected to the first chip pads 1121, respectively. The second contact patterns 1153 of the first RDL patterns 1150 may be connected to the first TMVs 1130X for connection, respectively. The first semiconductor chip 1120 may be electrically connected to the first TMVs 1130X for connection through the first RDL patterns 1150.

Referring to FIGS. 18 and 19, the first sub-package 1100 may include the first dielectric layer 1171 covering the first RDL patterns 1150, The first dielectric layer 1171 may extend to cover the first surface 1123 of the first semiconductor chip 1120 and the first surface 1112 of the first mold layer 1110. The first dielectric layer 1171 may have first opening holes 1175 that reveal the second contact patterns 1153 of the first RDL patterns 1150. In addition, the first dielectric layer 1171 may further have second opening holes 1179 that reveal ends of the first TMVs 1130Y for bypass.

Referring to FIGS. 18 and 20, the first sub-package 1100 may include second RDL patterns 1140X disposed on the surface 1171S of the first dielectric layer 1171 opposite to the first RDL patterns 1150. The second RDL patterns 1140X may be conductive patterns disposed and elongated on the surface 1171S of the first dielectric layer 1171. The second RDL patterns 1140X may partially overlap with the first RDL patterns 1150. The second RDL patterns 1140X may be located at a different level from the first RDL patterns 1150. The first RDL patterns 1150 may be located at a level between the first semiconductor chip 1120 and the second RDL patterns 1140X. The first RDL patterns 1150 may connect the first TMVs 1130X for connection to the first semiconductor chip 1120 and may also connect the second RDL patterns 1140X to the first TMVs 1130X for connection.

Referring to FIGS. 19 and 20, the first sub-package 1100 may further include third RDL patterns 1140Y disposed on the surface 1171S of the first dielectric layer 1171 to be distinct from the second RDL patterns 1140X. The third RDL patterns 1140Y may be conductive patterns elongated on the surface 1171S of the first dielectric layer 1171, As illustrated in a plan view of FIG. 20, regions in which the second RDL patterns 1140X are disposed may be distinct from regions in which the third RDL patterns 1140Y are disposed. That is, the second RDL patterns 1140X may be disposed not to vertically overlap with the third RDL patterns 1140Y in a plan view. The second RDL patterns 1140X may be disposed in first regions 1140G1 of the surface 1171S of the first dielectric layer 1171. The first regions 1140G1 may include two regions which are spaced apart from each other in the X-axis direction. The third RDL patterns 1140Y may be disposed in second regions 1140G2 of the surface 1171S of the first dielectric layer 1171. The second regions 1140G2 may include two regions which are spaced apart from each other in the Y-axis direction. In other embodiments, the first regions 1140G1 and the second regions 1140G2 may differ in geometry from the geometry illustrated by FIG. 20.

Referring to FIGS. 18 and 20, each of the second RDL patterns 1140X may include a second extension pattern 1145 and third and fourth contact patterns 1141 and 1143 respectively connected to both ends of the second extension pattern 1145. The third contact patterns 1141 of the second RDL patterns 1140X may be ball landing patterns which are provided to be electrically connected to an external device. The fourth contact patterns 1143 of the second RDL patterns 1140X may extend to fill the first opening holes 1175 and may contact the second contact patterns 1153 of the first RDL patterns 1150 through the first opening holes 1175. The fourth contact patterns 1143 of the second RDL patterns 1140X may vertically overlap and be in contact with the second contact patterns 1153 of the first RDL patterns 1150. That is, the fourth contact patterns 1143 of the second RDL patterns 1140X may be electrically connected to the second contact patterns 1153 of the first RDL patterns 1150, respectively. The fourth contact patterns 1143 of the second RDL patterns 1140X may be disposed to overlap with ends of the first TMVs 1130X for connection which are revealed at the first surface 1112 of the first mold layer 1110.

The fourth contact patterns 1143 may be disposed to overlap with portions of the first mold layer 1110 located at an outside region of the first semiconductor chip 1120, in a plan view. Each of the third contact patterns 1141 may be disposed to overlap with a portion of the first semiconductor chip 1120 or a portion of the first mold layer 1110 located at an outside region of the first semiconductor chip 1120, in a plan view. Since the second extension patterns 1145 connect the third contact patterns 1141 to the fourth contact patterns 1143, some of the second extension patterns 1145 may be disposed to overlap with both of the first semiconductor chip 1120 and the first mold layer 1110 located at an outside region of the first semiconductor chip 1120 in a plan view. As such, since at least one of the third contact patterns 1141 may be disposed to overlap with a portion of the first mold layer 1110 located at an outside region of the first semiconductor chip 1120, the first sub-package 1100 including the second RDL patterns 1140X may have a fan-out package structure.

Referring again to FIGS. 19 and 20, the third RDL patterns 1140Y may be disposed to have a configuration which is similar to a configuration of the second RDL patterns 1140X. Each of the third RDL patterns 1140Y may include a third extension pattern 1146 and fifth and sixth contact patterns 1142 and 1144 respectively connected to both ends of the third extension pattern 1146. The fifth contact patterns 1142 of the third RDL patterns 1140Y may be ball landing patterns which are provided to be electrically connected to an external device. The sixth contact patterns 1144 of the third RDL patterns 1140Y may be connected to the first TMVs 1130Y for bypass, respectively. The sixth contact patterns 1144 may be disposed to overlap with and be in contact with ends of the first TMVs 1130Y for bypass, which are revealed by the second opening holes 1179 of the first dielectric layer 1171. Some of the fifth contact patterns 1142 of the third RDL patterns 1140Y may be disposed to overlap with portions of the first mold layer 1110 located at an outside region of the first semiconductor chip 1120 in a plan view. Thus, the third RDL patterns 1140Y may also have a fan-out interconnection structure.

Referring to FIGS. 18 and 19, the first sub-package 1100 may further include a second dielectric layer 1173 covering the second and third RDL patterns 1140X and 1140Y. The second dielectric layer 1173 may extend to cover the surface 1171S of the first dielectric layer 1171. The second dielectric layer 1173 may have third opening holes 1177 that reveal the third contact patterns 1141 of the second RDL patterns 1140X and the fifth contact patterns 1142 of the third RDL patterns 1140Y.

The third contact patterns 1141 may function as signal transmission paths which are different from the fifth contact patterns 1142. For example, while signals applied to the third contact patterns 1141 are transmitted to the first semiconductor chip 1120 through the second RDL patterns 1140X and the first RDL patterns 1150, signals applied to the fifth contact patterns 1142 may be transmitted to another semiconductor chip, which is connected to the first TMVs 1130Y for bypass, through the third RDL patterns 1140Y and the first TMVs 1130Y for bypass.

Figure 22:
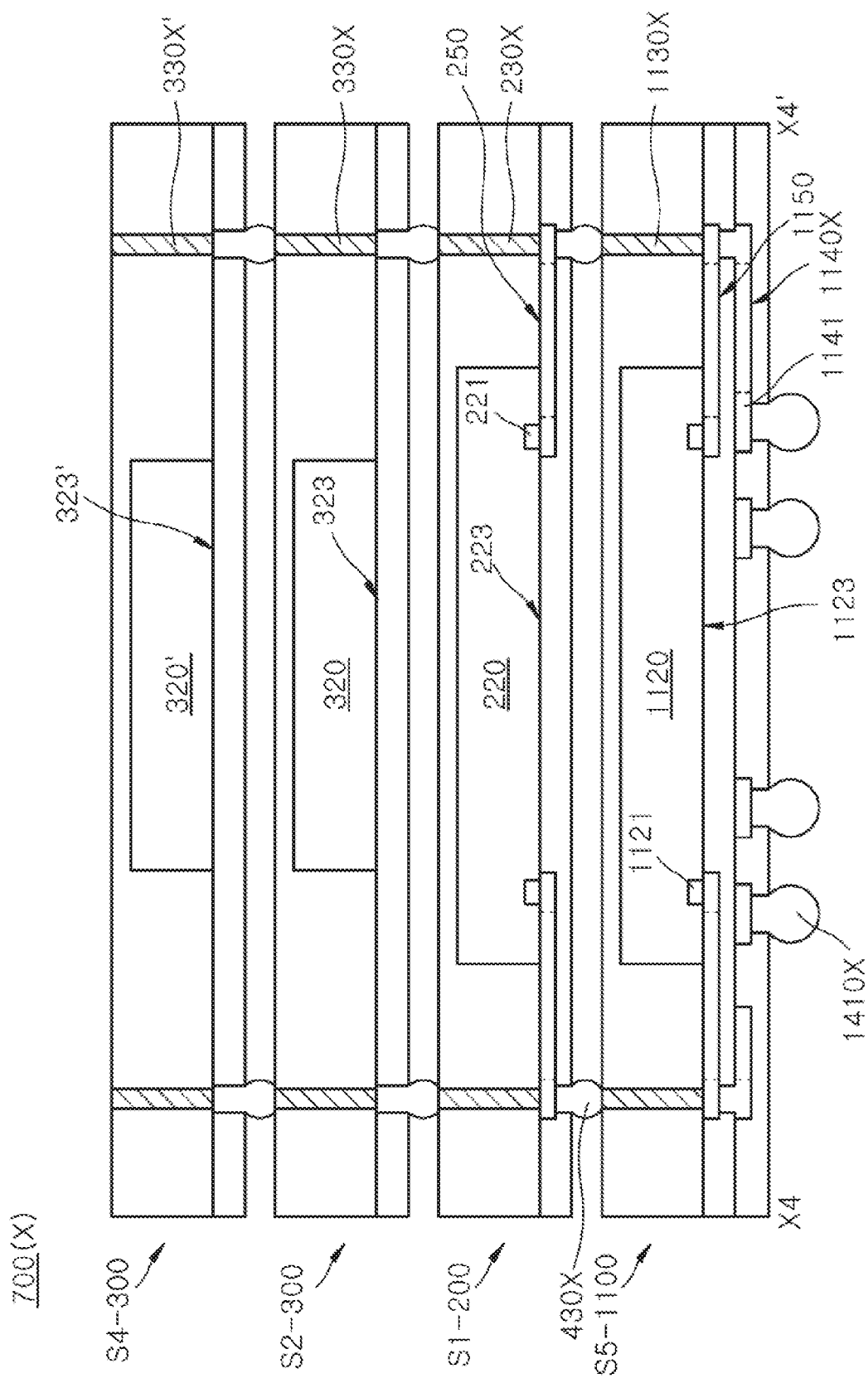
FIGS. 22 and 23 are cross-sectional views illustrating a stack package according to yet another embodiment.
Figure 23:
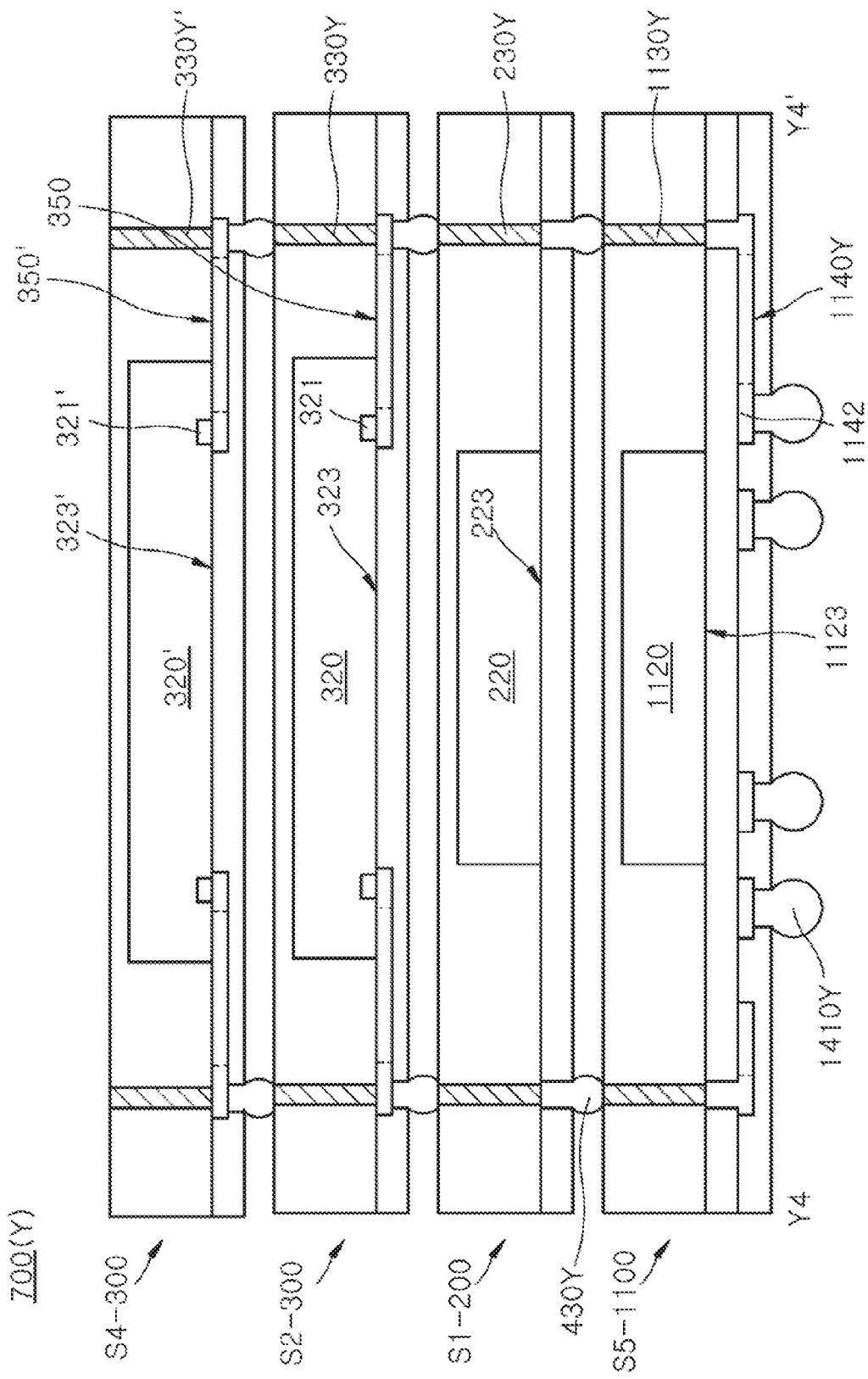

FIGS. 22 and 23 are cross-sectional views illustrating a stack package 700 according to yet another embodiment. FIG. 22 is a cross-sectional view 700(X) taken along an X-axis direction of the stack package 700, and FIG. 23 is a cross-sectional view 700(Y) taken along a Y-axis direction of the stack package 700. FIG. 22 is a cross-sectional view taken along a line X4-X4' of FIGS. 20 and 21, and FIG. 23 is a cross-sectional view taken along a line Y4-Y4' of FIGS. 20 and 21. In FIGS. 22 and 23, the same reference numerals as used in FIGS. 14 and 15 denote the same elements.

Referring to FIGS. 22 and 23, the stack package 700 may be configured to include the first sub-package (1100 illustrated in FIGS. 18 and 19), the second sub-package (200 of FIG. 6) and the two third sub-packages (300 of FIG. 10) which are sequentially and vertically stacked. The second sub-package 200 and the two third sub-packages 300 stacked on the first sub-package 1100 may be flipped to have a faced-down shape.

A first stage sub-package S5-1100 of the stack package 700 may be realized using the first sub-package 1100 illustrated in FIGS. 18 and 19. As illustrated in FIG. 22, the first stage sub-package S5-1100 may further include first outer connectors 1410X connected to the third contact patterns 1141 of the second RDL patterns 1140X. As illustrated in FIG. 23, the first stage sub-package S5-1100 may further include second outer connectors 1410Y connected to the fifth contact patterns 1142 of the third RDL patterns 1140Y. Connection paths (or connection channels) provided by the first outer connectors 1410X may be different from connection paths (or connection channels) provided by the second outer connectors 1410Y. The first outer connectors 1410X may provide a first channel for the stack package 700, and the second outer connectors 1410Y may provide a second channel for the stack package 700. Thus, the stack package 700 may be electrically and signally connected to an external device or system through two channels.

A second stage sub-package S1-200 of the stack package 700 may be realized by flipping the second sub-package 200 of FIG. 6 and stacking the flipped second sub-package 200 on the first stage sub-package S5-1100. A third stage sub-package S2-300 of the stack package 700 may be realized by flipping the third sub-package 300 of FIG. 10 and stacking the flipped second sub-package 300 on the second stage sub-package S1-200. A fourth stage sub-package S4-300 of the stack package 700 may be realized by flipping the third sub-package 300 of FIG. 10 and stacking the flipped second sub-package 300 on the third stage sub-package S2-300. The second semiconductor chip 220 in the second stage sub-package S1-200 may be disposed such that the first surface 223 (i.e., an active surface) of the second semiconductor chip 220 faces the same direction as the first surface 1123 of the first sub-package 1100. The third semiconductor chip 320 in the third stage sub-package S2-300 may also be disposed such that the first surface 323 (i.e., an active surface) of the third semiconductor chip 320 faces the same direction as the first surface 1123 of the first sub-package 1100. The fourth semiconductor chip 320' in the fourth stage sub-package S4-300 may also be disposed such that the first surface 323' (i.e., an active surface) of the fourth semiconductor chip 320' faces the same direction as the first surface 1123 of the first sub-package 1100. The first to fourth stage sub-packages S5-1100, S1-200, S2-300 and S4-300 may be electrically connected to each other through the inner connectors 430.

Referring to FIG. 22, the second TMVs 230X for connection of the second stage sub-package S1-200 may be electrically connected to the first TMVs 1130X for connection of the first stage sub-package S5-1100 located below the second stage sub-package S1-200. The second TMVs 230X for connection of the second stage sub-package S1-200 and the fourth RDL patterns 250 may act as connection paths of the second semiconductor chip 220. The second TMVs 230X for connection may be electrically connected to the first TMVs 1130X for connection through the first inner connectors 430X. The first TMVs 1130X for connection of the first stage sub-package S5-1100 may be electrically connected to the first outer connectors 1410X through the second RDL patterns 1140X.

The first outer connectors 1410X, the second RDL patterns 1140X, the first TMVs 1130X for connection of the first stage sub-package S5-1100, the second TMVs 230X for connection of the second stage sub-package S1-200, and the fourth RDL patterns 250 may act as electrical connection paths of the second semiconductor chip 220. In addition, the first outer connectors 1410X and the second and first RDL patterns 1140X and 1150 of the first stage sub-package S5-1100 may act as electrical connection paths of the first semiconductor chip 1120.

The third TMVs 330X for bypass of the third stage sub-package S2-300 may be electrically connected to the second TMVs 230X for connection of the second stage sub-package S1-200. However, the third TMVs 330X for bypass of the third stage sub-package S2-300 and fourth TMVs 330X' for bypass of the fourth stage sub-package S4-300 may correspond to dummy vias that are electrically disconnected from the third semiconductor chip 320 in the third stage sub-package S2-300 and the fourth semiconductor chip 320' in the fourth stage sub-package S4-300. Thus, the third semiconductor chip 320 embedded in the third stage sub-package S2-300 and the fourth semiconductor chip 320' embedded in the fourth stage sub-package S4-300 may be electrically disconnected from the first outer connectors 1410X. As such, since the third TMVs 330X for bypass of the third stage sub-package S2-300, the fourth TMVs 330X' for bypass of the fourth stage sub-package S4-300, and the second TMVs 230X for connection of the second stage sub-package S1-200 correspond to dummy vias, the third TMVs 330X, the fourth TMVs 330X' and the second TMVs 230X may be omitted in the stack package 700.

Referring to FIG. 23, the third TMVs 330Y for connection of the third stage sub-package S2-300 may be electrically connected to the third semiconductor chip 320 in the third stage sub-package S2-300 through the fifth RDL patterns 350. That is, the third TMVs 330Y for connection and fifth RDL patterns 350 may act as connection paths that electrically connect the third semiconductor chip 320 to another semiconductor chip or another sub-package. Similarly, the fourth TMVs 330Y' for connection of the fourth stage sub-package S4-300 may be electrically connected to the fourth semiconductor chip 320' in the fourth stage sub-package S4-300 through the sixth RDL patterns 350'. The fourth TMVs 330Y' for connection may have substantially the same shape as the third TMVs 330Y for connection, the sixth RDL patterns 350' may have substantially the same shape as the fifth RDL patterns 350, and the fourth semiconductor chip 320' may have substantially the same shape as the third semiconductor chip 320.

The second outer connectors 1410Y, the third RDL patterns 1140Y, the first TMVs 1130Y for bypass of the first stage sub-package S3-1100, the second TMVs 230Y for bypass of the second stage sub-package S1-200, and the fifth RDL patterns 350 may act as electrical connection paths of the third semiconductor chip 320. In addition, the second outer connectors 1410Y, the third RDL patterns 1140Y, the first TMVs 1130Y for bypass of the first stage sub-package S3-1100, the second TMVs 230Y for bypass of the second stage sub-package S1-200, the third TMVs 330Y for connection of the third stage sub-package S2-300, and the sixth RDL patterns 350' may act as electrical connection paths of the fourth semiconductor chip 320'. The second TMVs 230Y for bypass of the second stage sub-package S1-200 and the first TMVs 1130Y for bypass of the first stage sub-package S3-1100 may act as medium connection paths that connect the third TMVs 330Y for connection to the second outer connectors 1410Y. In such a case, the fourth TMVs 330Y' for connection of the fourth stage sub-package S4-300 may correspond to dummy vias. Thus, the fourth TMVs 330Y' may be omitted in the fourth stage sub-package S4-300.

Referring to FIGS. 22 and 23, the stack package 700 may be configured to include only the first to third stage sub-packages S5-1100, S1-200 and S2-300, which are sequentially stacked, without the fourth sub-package S4-300. Alternatively, the stack package 700 may be modified to include only the second and third stage sub-packages S1-200 and S2-300, which are sequentially stacked, without the first and fourth sub-packages S5-1100 and S4-300.

The stack package 700 illustrated in FIGS. 22 and 23 may be configured to include the first to fourth stage sub-packages S5-1100, S1-200, S2-300 and S4-300. However, in some other embodiments, the stack package 700 may be configured to include only two stages of sub-packages, for example, the first stage sub-package S5-1100 and the third stage sub-package S2-300 without the second and fourth stage sub-packages S1-200 and S4-300.

Figure 24:
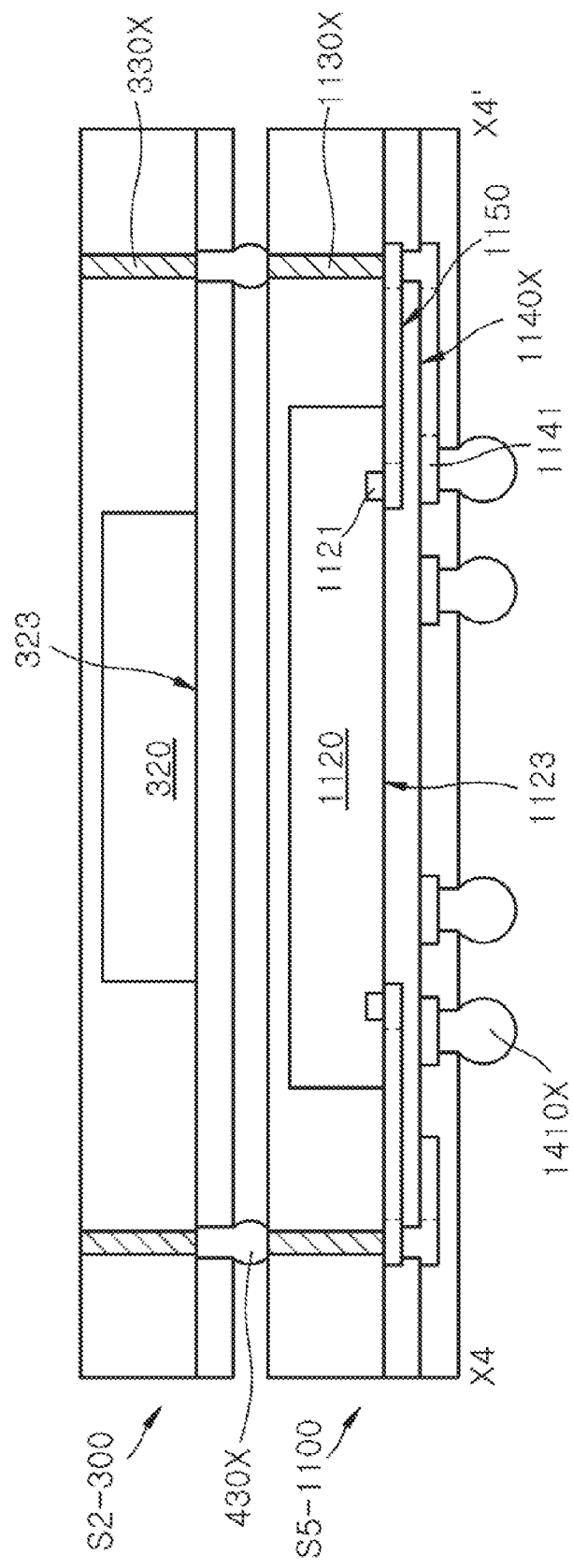
FIGS. 24 and 25 are cross-sectional views illustrating a stack package according to still another embodiment.
Figure 25:
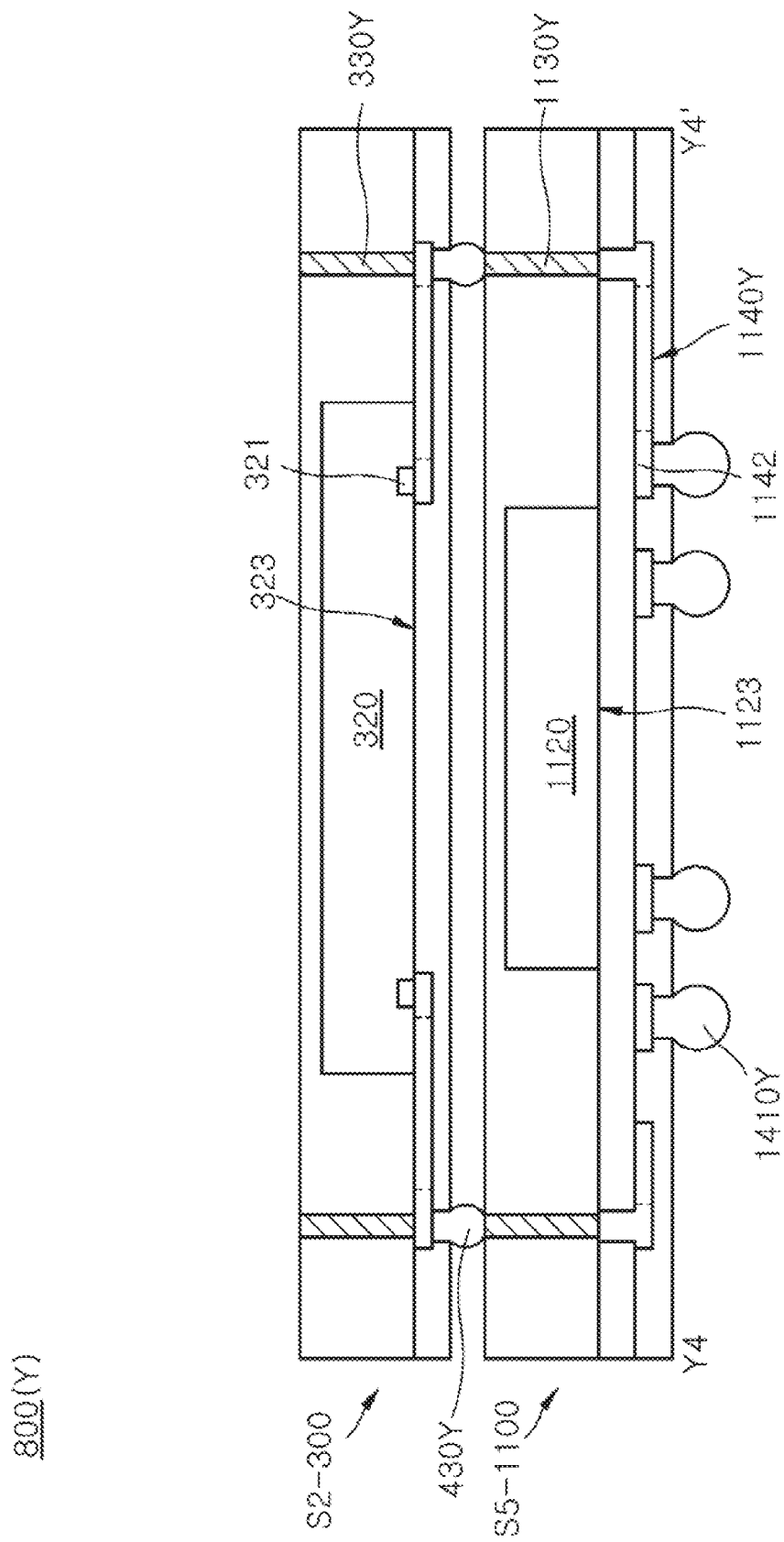

FIGS. 24 and 25 illustrate a stack package 800 including the first stage sub-package (S5-1100 of FIGS. 22 and 23) and the third stage sub-package (S2-300 of FIGS. 22 and 23) directly stacked on the first stage sub-package S5-1100. FIG. 24 is a cross-sectional view 800(X) taken along an X-axis direction of the stack package 800, and FIG. 25 is a cross-sectional view 800(Y) taken along a Y-axis direction of the stack package 800. FIG. 24 is a cross-sectional view taken along a line X4-X4' of FIGS. 20 and 21, and FIG. 25 is a cross-sectional view taken along a line Y4-Y4' of FIGS. 20 and 21.

Referring to FIGS. 24 and 25, the first TMVs 1130X for connection of the first stage sub-package S5-1100 and the third TMVs 330X for bypass of the third stage sub-package S2-300 may correspond to dummy vias. Thus, the first TMVs 1130X and the third TMVs 330X may be omitted in the stack package 800. The first TMVs 1130Y for bypass of the first stage sub-package S5-1100 may act as connection paths that electrically connect the third semiconductor chip 320 to the second outer connectors 1410Y.

Different embodiments may have different numbers of chips stacked in different orders with respect to their rotational orientations. Thus a stack of electrically connected TMVs spaced apart from the chips in the X-axis direction may electrically connect with a first group of chips and bypass a second group of remaining chips in the stack. A stack of electrically connected TMVs spaced apart from the chips in the Y-axis direction may electrically connect with the second group of chips and bypass the first group of chips.

Different embodiments may have different chip geometries and different relative angles of rotation between rotated chips. For example, square or rectangular four-sided chips may have a relative angle of rotation of 90 degrees, such that the Y-axis direction is rotated by 90 degrees from the X-axis direction. Hexagonal six-sided chips may have a relative angle of rotation of 60 degrees, such that the Y-axis direction is rotated by 60 degrees from the X-axis direction. Additionally, n-sided chips may have a relative angle of rotation of 360/n degrees between the X-axis direction and the Y-axis direction.

Figure 26:
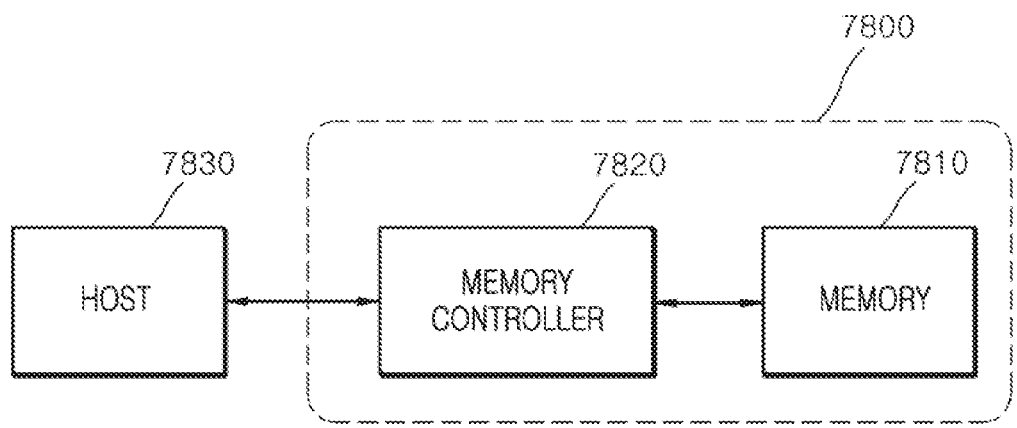
FIG. 26 is a block diagram illustrating an electronic system employing a memory card including a package according to an embodiment.

FIG. 26 illustrates a block diagram of an electronic system 7710 including a memory card 7800 employing at least one of the stack packages according to an embodiment of the present disclosure. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the stack packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 27:
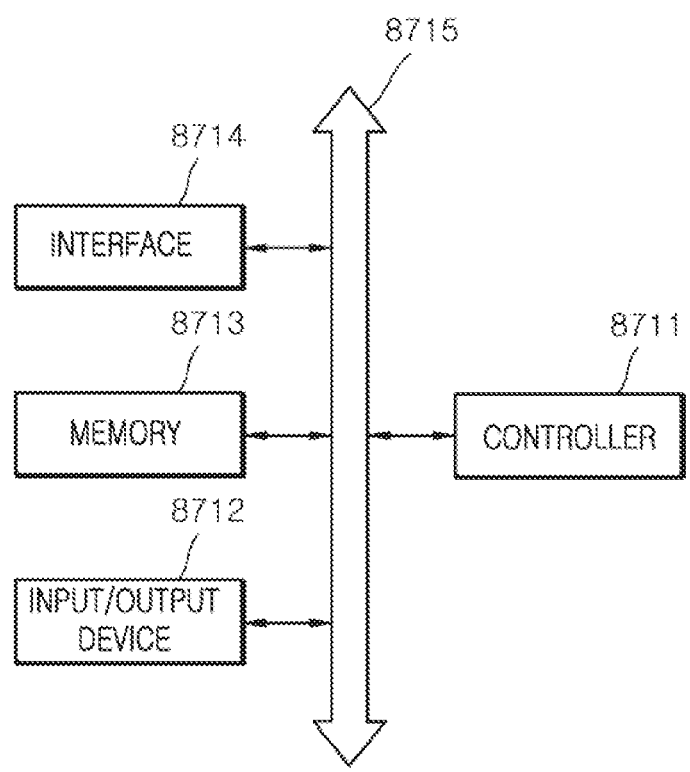
FIG. 27 is a block diagram illustrating another electronic system including a package according to an embodiment.

FIG. 27 is a block diagram illustrating an electronic system 8710 including at least one of the stack packages according to the embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the stack packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 represents equipment capable of performing wireless communication, the electronic system 8710 may be used in a communication system using a technique of CDMA (code division multiple access), GSM (global system for mobile communications), NADC (North American digital cellular), E-TDMA (enhanced-time division multiple access), WCDMA (wideband code division multiple access), CDMA2000, LTE (long term evolution) or WiBro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A stack package comprising:
a first sub-package;
a second sub-package stacked on the first sub-package;
a third sub-package stacked on the second sub-package opposite to the first sub-package; and
a fourth sub-package stacked on the third sub-package,
wherein the first sub-package comprises:
    a first semiconductor chip;
    a first through mold via (TMV) for connection spaced apart from the first semiconductor chip in an X-axis direction;
    a first TMV for bypass spaced apart from the first semiconductor chip in a Y-axis direction;
    a second redistribution line (RDL) pattern connecting the first semiconductor chip to a first outer connector; and
    a third RDL pattern connecting the first TMV for bypass to a second outer connector,
wherein the second sub-package comprises:
    a second semiconductor chip;
    a second TMV for bypass spaced apart from the second semiconductor chip in the Y-axis direction and connected to the first TMV for bypass; and
    a fourth RDL pattern connecting the second semiconductor chip to the first TMV for connection, and
wherein the third sub-package comprises:
    a third semiconductor chip;
    a third TMV for connection that is spaced apart from the third semiconductor chip in the Y-axis direction; and
    a fifth RDL pattern connecting the third semiconductor chip to the third TMV for connection and to the second TMV for bypass,
wherein the fourth sub-package comprises:
a fourth semiconductor chip;
a fourth TMV for connection spaced apart from the fourth semiconductor chip in the Y-axis direction and connected to the third TMV for connection; and
a sixth RDL pattern connecting the fourth semiconductor chip to the fourth TMV for connection, wherein the first TMV for bypass is disconnected from and electrically isolated from the first semiconductor chip, wherein the second TMV for bypass is disconnected from and electrically isolated from the second semiconductor chip, and wherein the third and the fourth TMVs for connection electrically connect the third and the fourth semiconductor chips to the second outer connector through the third RDL pattern and the first and the second TMVs for bypass without being electrically connected to the first and the second semiconductor chips.

2. The stack package of claim 1,
wherein the first sub-package further comprises a first RDL pattern that is connected between the first semiconductor chip and the first TMV for connection to connect the second RDL pattern to the first semiconductor chip through the first TMV for connection and the first RDL pattern.

3. The stack package of claim 2,
wherein the first sub-package further comprises a first mold layer covering at least side surfaces of the first semiconductor chip; and
wherein the first RDL pattern extends from a first surface of the first mold layer onto a surface of the first semiconductor chip.

4. The stack package of claim 3,
wherein the first RDL pattern is disposed over the second RDL pattern to vertically overlap with a portion of the second RDL pattern; and
wherein the first RDL pattern is located at a level which is different from a level of the second RDL pattern.

5. The stack package of claim 3, wherein both of the first TMV for connection and the first TMV for bypass substantially penetrate the first mold layer to extend from the first surface of the first mold layer and to reach a second surface of the first mold layer opposite to the first RDL pattern.

6. The stack package of claim 1, wherein the third RDL pattern is spaced apart from and electrically isolated from the first TMV for connection and the first semiconductor chip.

7. The stack package of claim 1,
wherein the second sub-package further comprises a second TMV for connection that is spaced apart from the second semiconductor chip in the X-axis direction and is connected to the first TMV for connection; and
wherein the fourth RDL pattern extends to connect the second semiconductor chip to the second TMV for connection.

8. The stack package of claim 7, wherein the third sub-package further comprises a third TMV for bypass that is spaced apart from the third semiconductor chip in the X-axis direction and is connected to the second TMV for connection.

9. The stack package of claim 8, wherein the fourth sub-package further comprises:
a fourth TMV for bypass spaced apart from the fourth semiconductor chip in the X-axis direction and is connected to the third TMV for bypass.

10. The stack package of claim 1,
wherein the fourth RDL pattern comprises a conductive pattern extending in the X-axis direction; and
wherein the fifth RDL pattern comprises a conductive pattern extending in the Y-axis direction.

11. The stack package of claim 1, wherein the third semiconductor chip overlaps the first semiconductor chip at substantially a right angle in an X-Y plane.

12. The stack package of claim 1, wherein the first TMV for bypass and the second TMV for bypass are connected to each other by a second inner connector including a bump.

* * * * *